US010536309B2

(12) United States Patent
Yun et al.

(10) Patent No.: US 10,536,309 B2
(45) Date of Patent: Jan. 14, 2020

(54) DEMODULATION OF ON-OFF-KEY MODULATED SIGNALS IN SIGNAL ISOLATOR SYSTEMS

(71) Applicant: Analog Devices, Inc., Norwood, MA (US)

(72) Inventors: Ruida Yun, Weston, MA (US); Eric C. Gaalaas, Bedford, MA (US); Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 4 days.

(21) Appl. No.: 14/883,342

(22) Filed: Oct. 14, 2015

(65) Prior Publication Data
US 2016/0080183 A1    Mar. 17, 2016

Related U.S. Application Data

(63) Continuation-in-part of application No. 14/486,951, filed on Sep. 15, 2014.

(51) Int. Cl.
*H04L 27/06* (2006.01)
*H03K 5/24* (2006.01)
*H03K 3/023* (2006.01)

(52) U.S. Cl.
CPC ............ *H04L 27/06* (2013.01); *H03K 3/023* (2013.01); *H03K 5/2481* (2013.01)

(58) Field of Classification Search
CPC . H04L 27/06; H04L 25/0266; H04L 25/0276; H03K 5/2481; H03K 3/023
See application file for complete search history.

(56) References Cited

U.S. PATENT DOCUMENTS

| 3,058,078 | A | 10/1962 | Hoh |
| 3,537,022 | A | 10/1970 | Regan |
| 3,714,540 | A | 1/1973 | Galloway |
| 3,760,198 | A | 9/1973 | Mori et al. |
| 3,798,608 | A | 3/1974 | Huebner |
| 3,808,673 | A | 5/1974 | Bottini |
| 4,024,452 | A | 5/1977 | Seidel |

(Continued)

FOREIGN PATENT DOCUMENTS

| CN | 101681901 A | 3/2010 |
| CN | 201976007 U | 9/2011 |

(Continued)

OTHER PUBLICATIONS

"IEEE Standard fora High Performance Serial Bus", IEEE Std 1394-1995, Microprocessor and Microcomputer Standards Committee, 1996, pp. i-viii, pp. 1-384.

(Continued)

*Primary Examiner* — Berhanu Tadese
(74) *Attorney, Agent, or Firm* — Wolf, Greenfield & Sacks, P.C.

(57) ABSTRACT

A receiver system for an on-off key ("OOK") isolator system may include a pair of receivers. A first receiver may generate a first current signal representing a received OOK signal, and a second receiver may generate a second current signal from a common mode representation of the received OOK signal. The receiver system may include circuitry to compare the first and second current signals and generate an output signal therefrom.

19 Claims, 7 Drawing Sheets

(56) References Cited

U.S. PATENT DOCUMENTS

| | | |
|---|---|---|
| 4,027,152 A | 5/1977 | Brown et al. |
| 4,035,710 A | 7/1977 | Joyce |
| 4,065,713 A | 12/1977 | Pollmeier |
| 4,118,603 A | 10/1978 | Kumhyr |
| 4,159,431 A | 6/1979 | Roozenbeek et al. |
| 4,227,045 A | 10/1980 | Chelcun et al. |
| 4,275,404 A | 6/1981 | Cassiday et al. |
| 4,302,807 A | 11/1981 | Mentler |
| 4,318,170 A | 3/1982 | Cabalfin |
| 4,321,487 A | 3/1982 | Huykman |
| 4,352,998 A | 10/1982 | Baker et al. |
| 4,415,820 A * | 11/1983 | Zogg .............. G06G 7/24 327/214 |
| 4,443,839 A | 4/1984 | Onodera et al. |
| 4,475,149 A | 10/1984 | Gallios |
| 4,538,136 A | 8/1985 | Drabing |
| 4,547,961 A | 10/1985 | Bokil et al. |
| 4,554,462 A | 11/1985 | Komiya et al. |
| 4,564,768 A | 1/1986 | Komiya et al. |
| 4,660,014 A | 4/1987 | Wenaas et al. |
| 4,703,283 A | 10/1987 | Samuels |
| 4,712,170 A | 12/1987 | Grace |
| 4,720,667 A | 1/1988 | Lee et al. |
| 4,737,851 A * | 4/1988 | Shanley, II .............. H04N 5/63 315/411 |
| 4,748,419 A | 5/1988 | Somerville |
| 4,780,795 A | 10/1988 | Meinel |
| 4,785,345 A | 11/1988 | Rawls et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,845,466 A | 7/1989 | Hariton et al. |
| 4,859,877 A | 8/1989 | Cooperman et al. |
| 4,864,589 A | 9/1989 | Endo |
| 4,879,505 A * | 11/1989 | Barrow .............. G04F 1/005 323/312 |
| 4,885,582 A | 12/1989 | LaBarge et al. |
| 4,899,152 A * | 2/1990 | Barrow .............. G04F 1/005 341/119 |
| 4,912,617 A | 3/1990 | Hartmann et al. |
| 4,920,474 A | 4/1990 | Bruning et al. |
| 4,922,883 A | 5/1990 | Iwasaki |
| 4,924,210 A | 5/1990 | Matsui et al. |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,136,455 A | 8/1992 | Billingsley |
| 5,142,432 A | 8/1992 | Schneider |
| 5,164,621 A | 11/1992 | Miyamoto |
| 5,204,551 A | 4/1993 | Bjornholt |
| 5,235,425 A | 8/1993 | Oh |
| 5,260,967 A | 11/1993 | Schilling |
| 5,270,882 A | 12/1993 | Jove et al. |
| 5,293,400 A | 3/1994 | Monod et al. |
| 5,300,896 A | 4/1994 | Suesserman |
| 5,325,355 A | 6/1994 | Oprescu et al. |
| 5,327,030 A | 7/1994 | DeVito et al. |
| 5,329,225 A | 7/1994 | Roshen et al. |
| 5,334,882 A | 8/1994 | Ting |
| 5,339,061 A | 8/1994 | Reick |
| 5,353,001 A | 10/1994 | Meinel et al. |
| 5,369,666 A | 11/1994 | Folwell et al. |
| 5,384,808 A | 1/1995 | Van Brunt et al. |
| 5,394,319 A | 2/1995 | Attwood et al. |
| 5,396,394 A | 3/1995 | Gee |
| 5,430,641 A | 7/1995 | Kates |
| 5,450,305 A | 9/1995 | Boys et al. |
| 5,467,607 A | 11/1995 | Harvey |
| 5,469,098 A | 11/1995 | Johnson, Jr. |
| 5,475,579 A | 12/1995 | John et al. |
| 5,484,012 A | 1/1996 | Hiratsuka |
| 5,488,627 A | 1/1996 | Hardin et al. |
| 5,533,054 A | 7/1996 | DeAndrea et al. |
| 5,539,241 A | 7/1996 | Abidi et al. |
| 5,539,598 A | 7/1996 | Denison et al. |
| 5,572,179 A | 11/1996 | Ito et al. |
| 5,588,021 A | 12/1996 | Hunt et al. |
| 5,596,466 A | 1/1997 | Ochi |
| 5,631,920 A | 5/1997 | Hardin |
| 5,636,110 A | 6/1997 | Lanni |
| 5,650,357 A | 7/1997 | Dobkin et al. |
| 5,663,768 A | 9/1997 | Yang |
| 5,701,037 A | 12/1997 | Weber et al. |
| 5,714,938 A | 2/1998 | Schwabl |
| 5,716,323 A | 2/1998 | Lee |
| 5,731,954 A | 3/1998 | Cheon |
| 5,757,338 A | 5/1998 | Bassetti et al. |
| 5,774,350 A | 6/1998 | Notaro et al. |
| 5,774,791 A | 6/1998 | Strohallen et al. |
| 5,781,071 A | 7/1998 | Kusunoki |
| 5,781,077 A | 7/1998 | Leitch et al. |
| 5,786,979 A | 7/1998 | Douglass |
| 5,801,602 A | 9/1998 | Fawal et al. |
| 5,812,598 A | 9/1998 | Sharma et al. |
| 5,825,259 A | 10/1998 | Harpham |
| 5,831,426 A | 11/1998 | Black, Jr. et al. |
| 5,831,525 A | 11/1998 | Harvey |
| 5,877,667 A | 3/1999 | Wollesen |
| 5,900,683 A | 5/1999 | Rinehart et al. |
| 5,900,764 A | 5/1999 | Imam et al. |
| 5,907,481 A | 5/1999 | Svardsjo |
| 5,910,780 A * | 6/1999 | Tam .............. H03K 17/16 326/113 |
| 5,913,817 A | 6/1999 | Lee |
| 5,926,358 A | 7/1999 | Dobkin et al. |
| 5,942,937 A | 8/1999 | Bell |
| 5,952,849 A * | 9/1999 | Haigh .............. H04L 25/493 326/56 |
| 5,959,482 A | 9/1999 | Fattori et al. |
| 5,969,590 A | 10/1999 | Gutierrez |
| 5,990,753 A | 11/1999 | Danstrom et al. |
| 5,998,979 A | 12/1999 | Nilsson |
| 6,000,128 A | 12/1999 | Umeno et al. |
| 6,016,050 A * | 1/2000 | Brokaw .............. G05F 3/205 323/315 |
| 6,025,705 A | 2/2000 | Nguyen et al. |
| 6,038,276 A | 3/2000 | Dinh |
| 6,040,986 A | 3/2000 | Sakamoto et al. |
| 6,049,258 A | 4/2000 | Fawal et al. |
| 6,054,780 A | 4/2000 | Haigh et al. |
| 6,069,802 A | 5/2000 | Priegnitz |
| 6,087,882 A | 7/2000 | Chen et al. |
| 6,104,003 A | 8/2000 | Jones |
| 6,124,756 A | 9/2000 | Yaklin et al. |
| 6,167,132 A * | 12/2000 | Krone .............. H04L 25/0266 341/143 |
| 6,167,134 A * | 12/2000 | Scott .............. H04L 25/0266 379/413 |
| 6,208,174 B1* | 3/2001 | Hopkins .............. H03F 3/3023 327/65 |
| 6,208,531 B1 | 3/2001 | Vinciarelli et al. |
| 6,222,922 B1* | 4/2001 | Scott .............. H04L 25/0266 379/32.04 |
| 6,229,346 B1 | 5/2001 | Milanese et al. |
| 6,249,171 B1 | 6/2001 | Yaklin et al. |
| 6,255,863 B1 | 7/2001 | Yamauchi et al. |
| 6,262,600 B1 | 7/2001 | Haigh et al. |
| 6,266,254 B1 | 7/2001 | Ohtake |
| 6,291,907 B1 | 9/2001 | Haigh et al. |
| 6,300,617 B1 | 10/2001 | Daughton et al. |
| 6,304,109 B1* | 10/2001 | Brokaw .............. H03F 3/45183 327/560 |
| 6,317,338 B1 | 11/2001 | Boys |
| 6,320,422 B1* | 11/2001 | Koh .............. H03K 5/2481 326/112 |
| 6,344,979 B1 | 2/2002 | Huang et al. |
| 6,359,983 B1 | 3/2002 | Krone et al. |

(56) References Cited

U.S. PATENT DOCUMENTS

| | | | |
|---|---|---|---|
| 6,377,313 B1 | 4/2002 | Yang et al. | |
| 6,377,646 B1 | 4/2002 | Sha | |
| 6,389,063 B1 | 5/2002 | Kanekawa et al. | |
| 6,396,329 B1 * | 5/2002 | Zerbe | G11C 7/02 327/319 |
| 6,400,227 B1 * | 6/2002 | Goldfarb | H03F 1/223 330/285 |
| 6,420,992 B1 | 7/2002 | Richmond | |
| 6,449,318 B1 | 9/2002 | Rumbaugh | |
| 6,501,363 B1 | 12/2002 | Hwu et al. | |
| 6,504,732 B2 | 1/2003 | Abe | |
| 6,525,566 B2 * | 2/2003 | Haigh | H04L 25/0266 326/31 |
| 6,538,532 B2 | 3/2003 | Petrovic | |
| 6,542,385 B1 | 4/2003 | Emmons et al. | |
| 6,553,057 B1 | 4/2003 | Sha et al. | |
| 6,556,075 B1 * | 4/2003 | Jordan | H03F 1/14 330/144 |
| 6,570,522 B1 | 5/2003 | Galambos et al. | |
| 6,573,940 B1 | 6/2003 | Yang | |
| 6,603,383 B2 | 8/2003 | Gevorgian et al. | |
| 6,603,807 B1 | 8/2003 | Yukutake et al. | |
| 6,606,260 B2 | 8/2003 | Ahlstrom | |
| 6,611,051 B2 | 8/2003 | Akiyama et al. | |
| 6,621,365 B1 | 9/2003 | Hallivuori et al. | |
| 6,686,768 B2 | 2/2004 | Comer | |
| 6,693,458 B1 | 2/2004 | Barrow | |
| 6,720,816 B2 | 4/2004 | Strzalkowski | |
| 6,728,320 B1 | 4/2004 | Khasnis et al. | |
| 6,738,240 B1 | 5/2004 | Ahn et al. | |
| 6,747,421 B2 | 6/2004 | Kohn | |
| 6,765,809 B2 | 7/2004 | Komori | |
| 6,774,683 B2 * | 8/2004 | Schafferer | H03K 17/04106 327/130 |
| 6,807,070 B2 | 10/2004 | Ribarich | |
| 6,819,169 B1 | 11/2004 | Kunc et al. | |
| 6,833,875 B1 | 12/2004 | Yang et al. | |
| 6,873,065 B2 | 3/2005 | Haigh et al. | |
| 6,903,578 B2 | 6/2005 | Haigh et al. | |
| 6,911,848 B2 | 6/2005 | Vinciarelli | |
| 6,911,860 B1 | 6/2005 | Wang et al. | |
| 6,922,080 B2 | 7/2005 | Haigh et al. | |
| 6,927,662 B2 | 8/2005 | Kahlmann et al. | |
| 6,970,022 B1 * | 11/2005 | Miller | H03K 3/3565 327/205 |
| 6,972,803 B2 | 12/2005 | Seth-Smith et al. | |
| 6,977,522 B1 | 12/2005 | Murabayashi et al. | |
| 6,993,087 B2 | 1/2006 | Rosnell et al. | |
| 7,010,621 B2 | 3/2006 | Calkins et al. | |
| 7,016,490 B2 | 3/2006 | Beutler et al. | |
| 7,061,189 B2 | 6/2006 | Newman, Jr. et al. | |
| 7,075,329 B2 | 7/2006 | Chen et al. | |
| 7,098,766 B2 | 8/2006 | Gardner et al. | |
| 7,102,388 B2 | 9/2006 | Murabayashi et al. | |
| 7,113,750 B2 | 9/2006 | Eastwood | |
| 7,116,183 B2 | 10/2006 | Wu | |
| 7,167,213 B1 | 1/2007 | Murdock et al. | |
| 7,171,739 B2 | 2/2007 | Yang et al. | |
| 7,199,562 B2 | 4/2007 | Muterspaugh | |
| 7,227,585 B1 | 6/2007 | Murdock et al. | |
| 7,253,565 B2 | 8/2007 | Kang et al. | |
| 7,277,491 B2 | 10/2007 | Dong et al. | |
| 7,334,417 B2 | 2/2008 | Tokushige et al. | |
| 7,376,212 B2 | 5/2008 | Dupuis | |
| 7,477,676 B2 | 1/2009 | Kokubo et al. | |
| 7,489,526 B2 | 2/2009 | Chen et al. | |
| 7,545,059 B2 | 6/2009 | Chen et al. | |
| 7,548,440 B2 | 6/2009 | Chen et al. | |
| 7,558,080 B2 | 7/2009 | Chen et al. | |
| 7,613,016 B2 | 11/2009 | Chen et al. | |
| 7,659,775 B2 * | 2/2010 | He | H03F 3/45085 327/108 |
| 7,671,372 B2 | 3/2010 | Morikawa | |
| 7,683,654 B2 | 3/2010 | Chen et al. | |
| 7,692,444 B2 | 4/2010 | Chen et al. | |
| 7,701,375 B1 | 4/2010 | Cosand | |
| 7,706,154 B2 | 4/2010 | Chen et al. | |
| 7,719,305 B2 | 5/2010 | Chen | |
| 7,741,896 B2 | 6/2010 | Chow et al. | |
| 7,881,461 B2 | 2/2011 | Skov et al. | |
| 7,902,627 B2 | 3/2011 | Dong et al. | |
| 7,919,781 B2 | 4/2011 | Wang et al. | |
| 7,920,010 B2 | 4/2011 | Chen, Jr. et al. | |
| 7,923,710 B2 | 4/2011 | Crawley et al. | |
| 8,084,894 B2 | 12/2011 | Chen | |
| 8,116,055 B2 | 2/2012 | Baumgartner et al. | |
| 8,169,108 B2 | 5/2012 | Dupuis et al. | |
| 8,175,172 B2 | 5/2012 | Yamamoto | |
| 8,364,195 B2 | 1/2013 | Spina et al. | |
| 8,428,539 B2 | 4/2013 | Dupuis | |
| 8,502,584 B1 * | 8/2013 | Dong | H04B 3/50 307/109 |
| 8,618,787 B1 | 12/2013 | Quinn | |
| 8,693,528 B1 | 4/2014 | Shrestha et al. | |
| 8,693,557 B1 | 4/2014 | Zhang et al. | |
| 8,724,355 B1 | 5/2014 | Pinkhasov et al. | |
| 8,736,343 B2 | 5/2014 | Chen et al. | |
| 8,829,955 B1 * | 9/2014 | Goswami | H03K 5/00 327/141 |
| 8,867,592 B2 | 10/2014 | Shrestha | |
| 9,083,232 B1 * | 7/2015 | Agarwal | H03M 1/70 |
| 9,319,256 B2 | 4/2016 | Park et al. | |
| 9,473,329 B1 | 10/2016 | Edwards et al. | |
| 9,660,848 B2 * | 5/2017 | Yun | H04L 27/04 |
| 9,762,282 B1 * | 9/2017 | Muellner | G06K 19/0723 |
| 9,998,301 B2 * | 6/2018 | Yun | H04L 25/0276 |
| 2002/0017935 A1 * | 2/2002 | Soda | H03L 7/0896 327/157 |
| 2002/0060587 A1 * | 5/2002 | Kimball | H04L 7/0331 327/108 |
| 2003/0042571 A1 | 3/2003 | Chen et al. | |
| 2003/0052712 A1 | 3/2003 | Comer | |
| 2003/0075990 A1 | 4/2003 | Guitton et al. | |
| 2003/0107411 A1 | 6/2003 | Martin et al. | |
| 2003/0163748 A1 | 8/2003 | Calkins et al. | |
| 2004/0076221 A1 | 4/2004 | Refaeli et al. | |
| 2004/0184289 A1 | 9/2004 | Vinciarelli | |
| 2004/0207763 A1 | 10/2004 | Ciardi | |
| 2005/0008113 A1 | 1/2005 | Kokubo et al. | |
| 2005/0033902 A1 | 2/2005 | Tamura | |
| 2005/0047511 A1 | 3/2005 | Dosho et al. | |
| 2005/0057277 A1 * | 3/2005 | Chen | H01F 17/0006 326/82 |
| 2005/0272378 A1 | 12/2005 | Dupuis | |
| 2005/0288739 A1 | 12/2005 | Hassler et al. | |
| 2006/0039169 A1 | 2/2006 | Chen et al. | |
| 2006/0109918 A1 | 5/2006 | Brown | |
| 2006/0119399 A1 * | 6/2006 | Tam | G11C 27/028 327/66 |
| 2006/0120115 A1 | 6/2006 | Chen et al. | |
| 2006/0202721 A1 * | 9/2006 | Partow | H03F 3/45183 327/65 |
| 2007/0052399 A1 | 3/2007 | Chen et al. | |
| 2007/0052514 A1 | 3/2007 | Chen et al. | |
| 2007/0097263 A1 | 5/2007 | Kim | |
| 2007/0116015 A1 * | 5/2007 | Jones | H03D 7/1441 370/396 |
| 2007/0133144 A1 | 6/2007 | Lewis | |
| 2007/0258513 A1 | 11/2007 | Strzalkowski | |
| 2008/0055190 A1 | 3/2008 | Lee | |
| 2008/0094046 A1 | 4/2008 | Chen et al. | |
| 2008/0136442 A1 * | 6/2008 | Chen | H03K 19/003 326/21 |
| 2008/0278275 A1 * | 11/2008 | Fouquet | H01F 27/2804 336/84 M |
| 2008/0279288 A1 | 11/2008 | Crawley et al. | |
| 2008/0311862 A1 * | 12/2008 | Spina | H01Q 1/38 455/78 |
| 2008/0315925 A1 | 12/2008 | Alfano et al. | |
| 2009/0028320 A1 | 1/2009 | Fuehrer et al. | |
| 2009/0168462 A1 * | 7/2009 | Schopfer | H02M 3/33523 363/21.01 |

(56) References Cited

U.S. PATENT DOCUMENTS

| | | | |
|---|---|---|---|
| 2009/0184754 A1 | 7/2009 | Chen | |
| 2009/0195082 A1 | 8/2009 | Chen | |
| 2009/0206960 A1 | 8/2009 | Ng et al. | |
| 2010/0052430 A1 | 3/2010 | Takaishi et al. | |
| 2010/0106041 A1* | 4/2010 | Ghovanloo | A61B 5/0006 600/544 |
| 2010/0111218 A1 | 5/2010 | Chen, Jr. | |
| 2010/0220828 A1* | 9/2010 | Fuller | H03F 3/45179 375/355 |
| 2010/0329364 A1* | 12/2010 | Giombanco | H04B 1/16 375/258 |
| 2011/0028104 A1 | 2/2011 | Giombanco et al. | |
| 2011/0248787 A1 | 10/2011 | Jiang | |
| 2011/0316629 A1* | 12/2011 | Zhang | H03F 3/45183 330/253 |
| 2012/0025921 A1 | 2/2012 | Yang et al. | |
| 2012/0074990 A1 | 3/2012 | Sornin | |
| 2012/0112822 A1 | 5/2012 | Marshall | |
| 2012/0212251 A1 | 8/2012 | Yanagishima et al. | |
| 2012/0280732 A1* | 11/2012 | Roytman | H03K 5/086 327/175 |
| 2013/0002366 A1* | 1/2013 | Sabut | H03K 7/08 332/110 |
| 2013/0049839 A1* | 2/2013 | Cheng | H04W 52/0229 327/306 |
| 2013/0106515 A1 | 5/2013 | Lin | |
| 2013/0142522 A1* | 6/2013 | Itabashi | H04B 10/60 398/209 |
| 2013/0278077 A1* | 10/2013 | Mueck | H02J 1/02 307/105 |
| 2013/0278438 A1* | 10/2013 | Mueck | G08C 15/00 340/870.16 |
| 2013/0279611 A1* | 10/2013 | Mueck | H04L 7/0016 375/259 |
| 2013/0285465 A1 | 10/2013 | Takeda et al. | |
| 2013/0301690 A1* | 11/2013 | Shrestha | H04L 25/0268 375/219 |
| 2014/0062527 A1 | 3/2014 | Mills et al. | |
| 2014/0091954 A1* | 4/2014 | Zhu | H02M 3/06 341/110 |
| 2014/0153325 A1* | 6/2014 | Wang | G11C 13/0004 365/158 |
| 2014/0169038 A1* | 6/2014 | Kamath | H03D 3/00 363/16 |
| 2014/0286446 A1* | 9/2014 | Takeda | H04L 25/026 375/258 |
| 2015/0110224 A1 | 4/2015 | Kang et al. | |
| 2015/0222241 A1 | 8/2015 | Brudermann et al. | |
| 2015/0236698 A1 | 8/2015 | Pedersen | |
| 2015/0256369 A1 | 9/2015 | Park et al. | |
| 2016/0080181 A1* | 3/2016 | Yun | H04L 27/04 375/312 |
| 2016/0080182 A1* | 3/2016 | Yun | H04L 25/08 375/320 |
| 2016/0080183 A1* | 3/2016 | Yun | H04L 27/06 375/320 |
| 2016/0087914 A1 | 3/2016 | Goswami et al. | |
| 2016/0126724 A1 | 5/2016 | Yun et al. | |
| 2017/0141803 A1* | 5/2017 | Chakraborty | H04B 1/06 |

FOREIGN PATENT DOCUMENTS

| | | | |
|---|---|---|---|
| CN | 102307003 A | 1/2012 | |
| CN | 102437849 A | 5/2012 | |
| CN | 102484449 A | 5/2012 | |
| CN | 103580607 A | 2/2014 | |
| CN | 103607201 A | 2/2014 | |
| CN | 101877683 B | 8/2014 | |
| CN | 104852727 A | 8/2015 | |
| DE | 2529296 A1 | 1/1977 | |
| DE | 19718420 A1 | 11/1998 | |
| DE | 19922129 C1 | 9/2000 | |
| DE | 19922123 A1 | 11/2000 | |
| DE | 19922127 A1 | 11/2000 | |
| DE | 19922128 C1 | 1/2001 | |
| DE | 10100282 A1 | 7/2002 | |
| DE | 102009039414 A1 | 3/2010 | |
| EP | 0282102 A2 | 9/1988 | |
| EP | 0307345 A1 | 3/1989 | |
| EP | 0586062 A1 | 3/1994 | |
| EP | 0708529 A2 | 4/1996 | |
| EP | 07 39 552 A1 | 10/1996 | |
| EP | 0739552 A1 * | 10/1996 | H03K 19/013 |
| EP | 0 913 947 A2 | 5/1999 | |
| EP | 0917309 A2 | 5/1999 | |
| EP | 0977406 A1 | 2/2000 | |
| EP | 1 168 804 A2 | 1/2002 | |
| EP | 1209791 A2 | 5/2002 | |
| EP | 1 753 129 A1 | 2/2007 | |
| EP | 1753129 A1 * | 2/2007 | H03F 3/45179 |
| EP | 1753129 A1 * | 2/2007 | H03F 3/45179 |
| EP | 1 990 914 A2 | 11/2008 | |
| EP | 2 280 488 A1 | 2/2011 | |
| EP | 2282405 A2 | 2/2011 | |
| EP | 1171980 B1 | 11/2011 | |
| EP | 1550194 B1 | 11/2012 | |
| EP | 2645589 A1 | 10/2013 | |
| EP | 3 002 875 A1 | 4/2016 | |
| FR | 2679670 A1 | 1/1993 | |
| GB | 2173956 A | 10/1986 | |
| JP | S57132460 A | 8/1982 | |
| JP | S58215833 A | 12/1983 | |
| JP | H07115768 A | 5/1995 | |
| JP | H0937558 A | 2/1997 | |
| JP | H10178398 A | 6/1998 | |
| JP | H10191654 A | 7/1998 | |
| JP | 2002508916 A | 3/2002 | |
| JP | 2002-118605 A | 4/2002 | |
| JP | 2002262545 A | 9/2002 | |
| JP | 2010-088112 A | 4/2010 | |
| JP | 2011134347 A | 7/2011 | |
| TW | 200635245 A | 10/2006 | |
| WO | 81/00658 A1 | 3/1981 | |
| WO | 95/05033 A1 | 2/1995 | |
| WO | WO-9505033 A1 * | 2/1995 | H03K 19/013 |
| WO | WO 9505033 A1 * | 2/1995 | H03K 19/013 |
| WO | WO-9520768 A1 | 8/1995 | |
| WO | WO 97/17763 A2 | 5/1997 | |
| WO | WO-9717763 A2 * | 5/1997 | H03K 19/018528 |
| WO | WO 9717763 A2 * | 5/1997 | H03K 19/018528 |
| WO | WO-9837672 A1 | 8/1998 | |
| WO | WO-9848541 A2 | 10/1998 | |
| WO | WO-9921332 A1 | 4/1999 | |
| WO | WO-0128094 A1 | 4/2001 | |
| WO | WO-0161951 A1 | 8/2001 | |
| WO | WO-02073914 A1 | 9/2002 | |
| WO | WO-02086969 A2 | 10/2002 | |
| WO | WO 2004/100473 A2 | 11/2004 | |
| WO | WO-200586062 A2 | 9/2005 | |
| WO | WO 2012/036014 A1 | 3/2012 | |
| WO | 2012/085951 A1 | 6/2012 | |
| WO | WO-2012085951 A1 * | 6/2012 | H03K 17/08104 |
| WO | WO 2012085951 A1 * | 6/2012 | H03K 17/08104 |
| WO | WO-2014036594 A1 | 3/2014 | |

OTHER PUBLICATIONS

Akiyama et al., "A High-Voltage Monolithic Isolator for a Communication Network Interface," IEEE Transactions on Electron Devices, vol. 49, No. 5, May 2002, pp. 895-901.

All About Circuits, "An Electric Pendulum", Textbook, vol. II—Alternating Circuit (AC), Chapter 6: Resonance, allaboutcircuits.com, Jul. 12, 2004, 5 pages.

Analog Devices, "Frequently Asked Questions: Isolation, iCoupler Technology, and iCoupler Products", Mar. 2006, 10 pages.

Analog Devices, "High Precision, Low Offset, mV Input Isolation Amplifier", AD208 datasheet, 16 pages.

Analog Devices, "High Speed Digital Isolators", ADuM1100AR/ADuM1100BR datasheet, Rev. 0, 2001, 12 pages.

Analog Devices, "High Speed, Logic Isolator With Power Transformer", AD260 datasheet, Rev. 0, Sep. 1998, 8 pages.

(56) References Cited

OTHER PUBLICATIONS

Analog Devices, "iCoupler Digital Isolation Products", 2005, 12 pages.
Analog Devices, "iCoupler Isolation in RS-232 Applications", Application Note AN-740, Rev. 0, Jul. 2004, 8 pages.
Analog Devices, "iCoupler Isolation in RS-485 Applications", Application Note AN-727, Rev. 0, Jun. 2004, 12 pages.
Analog Devices, "Low Cost, Miniature Isolation Amplifiers", AD202/AD204 datasheet, Rev. B, 1994, 12 pages.
Analog Devices, "Precision, Wide Bandwidth 3-Port Isolation Amplifier", AD210 datasheet, Rev. A, 8 pages.
Analog Devices, "Rugged, Military Temperature Range, 10 kHz Bandwidth Isolation Amplifier", AD203SN datasheet, Rev. A, 12 pages.
Avago Technologies, "Dual-Channel High Speed 15 MBd CMOS Optocoupler", QCPL-073H datasheet, Jul. 2007, 10 pages.
Avago Technologies, "Single-Channel High Speed 15 MBd CMOS Optocoupler" QCPL-070H datasheet, Jul. 2007, 10 pages.
Banerjee and Kliger, "Micromachined Magnetics: a New Step in the Evolution of Isolation Technology", Electronic Engineering, Jun. 2000, pp. 27-32.
Baumann, "Free-Running Bridge Inverter", IBM Technical Disclosure Bulletin, vol. 9, No. 10, Mar. 1967, p. 1462.
Bourgeois, "PCB Based Transformer for Power MOSFET Drive", IEEE, 1994, pp. 238-244.
Burr-Brown, "Dual, Isolated, Bi-Directional Digital Coupler", ISO150 datasheet, 3 versions, 1993-2007, 38 pages.
Business Wire, "Emerson Selects Analog Devices' Digital Isolation Technology for Industrial Systems; ADI's iCoupler Technology Enables Low-Cost Signal Isolation in High-Temperature Environments", Sep. 24, 2003, 2 pages.
Business Wire, "Pulse's New Miniature Transformers are Optimized for Wideband RF Applications", Jul. 26, 2000, 2 pages.
Chang et al., "A Spread-Spectrum Clock Generator with Triangular Modulation", IEEE Journal of Solid-State Circuits, vol. 38, No. 4, Apr. 2003, pp. 673-676.
Chen et al., "High Speed Digital Isolators Using Microscale On-Chip Transformers", Elektronik, Jul. 22, 2003, English version, 6 pages.
Chiu et al., "Thin-Film Inductive Heads", IBM J. Res. Develop., vol. 40, No. 3, May 1996, pp. 283-300.
Christiansen, "Pulse-Code Modulation (PCM)", Electronics Engineers' Handbook, Fourth Edition, McGraw-Hill, Inc., 1996, 3 pages (unnumbered).
Chu et al., "High-Voltage CMOS Decoder/Driver for Plasma Displays", 1976 IEEE International Solid-State Circuits Conference (ISSCC 76), Digest of Technical Papers, vol. XIX, Feb 1976, pp. 212-213.
Cypress Semiconductor, "Spread Spectrum Clock Generator", SM560 datasheet, Rev. E, Jun. 2004, 8 pages.
Cypress Semiconductor, "Spread Spectrum Clock Generator", SM561 datasheet, Rev. C, Dec. 2002, 8 pages.
Dotter et al., "Implementation of an Adaptive Balancing Hybrid", IEEE Transactions on Communications, vol. 28, No. 8, Aug. 1980, pp. 1408-1416.
EDN Network, "Welcome to the 17th Annual EDN Innovation Awards: EDN's 2006 Innovation Awards Nominees—Nominee Detail—ADuM125xl2C Digital Isolators (Analog Devices)", Reed Business Information, 2007, 2 pages.
EE Times Asia, "ADI Digital Isolators Reduce Per-Channel Costs", New Products, Jun. 19, 2003, 1 page.
EE Times Online, "EE Times Names ACE Finalists", Latest News, Jan. 15, 2007, 3 pages.
El-Hammanmsy, "Design of High-Efficiency RF Class-D Power Amplifier", IEEE Transactions on Power Electronics, vol. 9, No. 3, May 1994, pp. 297-308.
Fleming, "Isolation Amplifiers Break Ground Loops and Achieve High CMRR", EDN, vol. 32, No. 26, Dec. 24, 1987, pp. 97-102, and p. 5.

Gallo et al., "An Unity High Power Factor Power Supply Rectifier Using a PWM AC/DC Full Bridge Soft-Switching", 17th Annual IEEE Applied Power Electronics Conference and Exposition (APEC 2002), Mar. 2002, pp. 1190-1194.
Geen et al., "Miniature Multilayer Spiral Inductors for GaAs MMICs", 11th Annual IEEE Gallium Arsenide Integrated Circuit (GaAs IC) Symposium, Oct. 22-25, 1989, Technical Digest, pp. 303-306.
Ghiorse and Ranta, "Isolation in Medical Applications", Power Electronics Europe, Jul. 2005, 2 pages.
Greenhouse, "Design of Planar Rectangular Microelectronic Inductors", IEEE Transactions on Parts, Hybrids, and Packaging, vol. 10, No. 2, Jun. 1974, pp. 101-109.
Hermann et al., "Magnetically Coupled Linear Isolator", IEEE Transactions on Magnetics, vol. 33, No. 5, Sep. 1997, pp. 4029-4031.
Hewlett Packard, "40 ns Prop. Delay, SO-8 Optocoupler", HCPL-0710 Technical Data, 16 pages.
International Microcircuits, "Low EMI Spectrum Spread Clock", SM530 datasheet, Rev. 1.6, Jan. 1999, 16 pages.
Irvine, "Early Digital Computers at Bell Telephone Laboratories", IEEE Annals of the History of Computing, Jul.-Sep. 2001, pp. 22-42.
Jaycar Electronics, "DC-DC Converters: A Primer", DCDCONV Reference Data Sheet, 2001, 5 pages.
Kehrer, "Design of Monolithic Integrated Lumped Transformers in Silicon-based Technologies up to 20 GHz", Master's thesis, Technical University of Vienna, Institute of Communications and Radio-Frequency Engineering, Dec. 2000, 85 pages.
Kester, "Digital Isolation Techniques", Practical Design Techniques for Sensor Signal Conditioning, Section 10: Hardware Design Techniques, Analog Devices, Inc., 1999, pp. 10.55-10.57.
Kester, "Origins of Real-World Signals and Their Units of Measurement", Mixed Signal and DSP Design Techniques, Section 1: Introduction, Newnes, 2003, pp. 1.1-1.10.
Kliger et al., "Isolation with Waferscale Transformers", Digital Isolation, Power Electronics Europe, Issue 6, 2005, pp. 40-43.
Kliger, "Integrated Transformer-Coupled Isolation", IEEE Instrumentation & Measurement Magazine, Mar. 2003, pp. 16-19.
Knoedl, Jr., et al., "A Monolithic Signal Isolator", 4th Annual IEEE Applied Power Electronics Conference and Exposition (APEC '89), Mar. 13-17, 1989, Conference Proceedings, pp. 165-170.
Kojima et al., "2.3 kVac 100 MHz Multi-Channel Monolithic Isolator IC," 12th International Symposium on Power Semiconductor Devices and ICs (ISPSD'2000), May 2000, pp. 309-312.
Kojima et al., "A Novel Monolithic Isolator fora Communications Network Interface IC", 11th Annual IEEE International ASIC Conference, Sep. 1998, pp. 255-258.
Kuhn et al., "An RF-Based IEEE 1394 Ground Isolator Designed in a Silicon-on-Insulator Process", 44th IEEE Midwest Symposium on Circuits and Systems (MWSCAS 2001), Aug. 2001, pp. 764-767.
Kuisma, "Variable Frequency Switching in Power Supply EMI-Control: An Overview", IEEE AES Systems Magazine, Dec. 2003, pp. 18-22.
Lam et al., "High-Isolation Bonding Pad Design for Silicon RFIC up to 20 GHz", IEEE Electron Device Letters, vol. 24, No. 9, Sep. 2003, pp. 601-603.
Laughton et al., "Digital Control Systems", Electrical Engineer's Reference Book, Sixteenth Edition, Chapter 14, Newnes, 2003, 3 cover sheets (unnumbered), pp. 14/6-14/9.
Ledwich, "DC-DC Converter Basics", Power Designers, 1998, www.powerdesigners.com, 11 pages.
Long et al., "A 1.9 GHz Low-Voltage Silicon Bipolar Receiver Front-End for Wireless Personal Communications Systems", IEEE Journal of Solid-State Circuits, vol. 30, No. 12, Dec. 1995, pp. 1438-1448.
Moss et al., "Integrated Circuit D-MOS Telephone Crosspoint Array," 1976 IEEE International Solid-State Circuits Conference (ISSCC 76), Digest of Technical Papers, vol. XIX, Feb. 1976, pp. 32-33, 226.
National Instruments, "Isolation Technologies for Reliable Industrial Measurements", Whitepaper, 2006, 11 pages.

(56) References Cited

OTHER PUBLICATIONS

National Instruments, "Technologies behind NI Industrial M and S Series Data Acquisition Devices with Isolation", NI Developer Zone, Oct. 3, 2007, 5 pages.

Ng et al., "Optimized Geometrical Features of Monolithic Spiral RF Transformers on Silicon", SAFE ProRISC SeSens 2001, Conference Proceedings, Nov. 2001, pp. 132-135.

Nihtianov, "Magnetogalvanic Approach to Isolation of Analog Circuits", IEEE Transactions on Instrumentation and Measurement, vol. 43, No. 4, Aug. 1994, pp. 677-680.

Niknejad et al., "Analysis, Design, and Optimization of Spiral Inductors and Transformers for Si RF ICs", IEEE Journal of Solid-State Circuits, vol. 33, No. 10, Oct. 1998, pp. 1470-1481.

NVE Corporation, "High Speed Digital Coupler", IL710 datasheet, Jul. 2002, 8 pages.

NVE Corporation, "High Speed Five-Channel Digital Isolators", IL260/IL261 datasheet, Rev. E, Apr. 2007, 11 pages.

Park et al., "Packaging Compatible Microtransformers on a Silicon Substrate", IEEE Transactions on Advanced Packaging, vol. 26, No. 2, May 2003, pp. 160-164.

Pickering, "A System Designer's Guide to Isolation Devices", Sensors, Jan. 1999, pp. 14-26 (7 pages).

PICO Electronics, "Audio Transformers: 2 Ohm to 40K Ohm; 400 Hz to 100 KHz, 400 miliwatt at 1 KHz", datasheet, 8 pages.

PowerZONE, "ADuM1300/01/1400/01/02: Multi-Channel Digital Isolators for High-Voltage Industrial Applications", powerZONE Products for the week of May 26, 2003, 2 pages.

PR Newswire, "Electronics Technology Elite Compete for Industry's Highest Honors as EE Times Announces Finalists for 2007 EE Times ACE Awards", Jan. 15, 2007, 5 pages.

Premier Devices, "Surface Mount Transformer", XFA-0401-1U datasheet, 1 page.

Pulse Engineering, "RF Transformers, Transformers for Wideband RF Applications", C244.A datasheet, Oct. 2004, 2 pages.

Ronkainen et al., "IC Compatible Planar Inductors on Silicon", IEE Proceedings—Circuits Devices Systems, vol. 144, No. 1, Feb. 1997, pp. 29-35.

Roth, Jr., "Clocked Flip-Flops with Clear and Preset Inputs", Fundamentals of Logic Design, Third Edition, 1985, 2 Cover Sheets (unnumbered), pp. 254-256.

Roth, Jr., "MOS and CMOS Logic", Fundamentals of Logic Design, Third Edition, 1985, 2 Cover Sheets (unnumbered), pp. 613-616.

Sayani et al., "Isolated Feedback for Off-Line Switching Power Supplies with Primary-Side Control", 3rd Annual IEEE Applied Power Electronics Conference and Exposition (APEC '88), Feb. 1988, pp. 203-211 (5 pages).

Shin et al., "A 250-Mbit/s CMOS Crosspoint Switch", IEEE Journal of Solid-State Circuits, vol. 24, No. 2, Apr. 1989, pp. 478-486.

Silicon Laboratories, "Global Line-Side DAA for Embedded System-Side Module," Si306x datasheet, Rev. 0.9, Jan. 2005, 62 pages.

Silicon Laboratories, "Highlights of the Si844x Quad Digital Isolators", date unknown, 1 page.

Silicon Laboratories, "Quad-Channel Digital Isolator", Si8440/41/42/45 datasheet, Rev. 0.6, Aug. 2007, 30 pages.

Silicon Laboratories, "Silicon Laboratories Announces Industry's Fastest, Most Integrated Four Channel Digital Isolators", News Release, Mar. 20, 2006, 3 pages.

Silicon Laboratories, "Triple-Channel Digital Isolator", Si8430/31/35 datasheet, Rev. 0.3, Aug. 2007, 30 pages.

Simburger et al., "A Monolithic Transformer Coupled 5-W Silicon Power Amplifier with 59% PAE at 0.9 GHz", IEEE Journal of Solid-State Circuits, vol. 34, No. 12, Dec. 1999, pp. 1881-1892.

Small, "Medical Devices Demand Stringent Isolation Techniques", EDN, Sep. 28, 2006, pp. 41-49.

Standard Handbook for Electrical Engineers, "Carrier Communication, Tone Multiplex Equipment", Tenth Edition, McGraw-Hill, 1968, 2 Cover Sheets (unnumbered), pp. 15-75 and 15-84, 15-85.

Streetman, "Monolithic Device Elements", Solid State Electronic Devices, Second Edition, Prentice-Hall, 1980, 2 Cover Sheets (unnumbered), pp. 346-347.

Streetman, "Semiconductor Materials" and "Monolithic Device Elements", Solid State Electronic Devices, Third Edition, Prentice Hall, 1990, pp. 1-2 and p. 355.

Sugawara et al., "1.5 Gbps, 5150 ppm Spread Spectrum SerDes PHY with a 0.3 mW, 1.5 Gbps Level Detector for Serial ATA", IEEE 2002 Symposium on VLSI Circuits, Digest of Technical Papers, Jun. 2002, pp. 60-63.

Sze, "Physics and Properties of Semiconductors—A Resume", Physics of Semiconductor Devices, Second Edition, John Wiley & Sons, 1981, 2 Cover Sheets (unnumbered), and p. 7.

Tabisz et al., "Zero-Voltage-Switched Quasi-Resonant Buck and Flyback Converters—Experimental Results at 10MHz", IEEE Transactions on Power Electronics, vol. 4, No. 2, Apr. 1989, pp. 194-204.

Tang, et al., "A Low-Profile Low-Power Converter with Coreless PCB Isolation Transformer", IEEE Transactions on Power Electronics, vol. 16, No. 3, May 2001, pp. 311-315.

Tang, et al., "A Low-Profile Wide-Band Three-Port Isolation Amplifier with Careless Printed-Circuit-Board (PCB) Transformers", IEEE Transactions on Industrial Electronics, vol. 48, No. 6, Dec. 2001, pp. 1180-1187.

Texas Instruments, "3.3-V/5-V High-Speed Digital Isolators", ISO721/ISO722 datasheet, Jan. 2006 (revised Feb. 2007), 24 pages.

Texas Instruments, "Dual Digital Isolators", ISO7220/ISO7221 datasheet, Jul. 2006 (revised Aug. 2007), 25 pages.

Texas Instruments, "Quad Digital Isolators", ISO7240/ISO7241/ISO7242 datasheet, Sep. 2007 (revised Dec. 2007), 25 pages.

Tsang et al., "Design, Fabrication, and Performance of Spin-Valve Read Heads for Magnetic Recording Applications", IBM J. Res. Develop, vol. 42, No. 1, Jan. 1998, pp. 103-116.

Tse et al., "Analysis and Spectral Characteristics of a Spread-Spectrum Technique for Conducted EMI Suppression", IEEE Transactions on Power Electronics, vol. 15, No. 2, Mar. 2000, pp. 399-410.

Walker et al., "An Isolated MOSFET Gate Driver", Australasian Universities Power Engineering Conference (AUPEC '96), Oct. 1996, pp. 175-180.

Wedlock et al., "Capacitors", Electronic Components and Measurements, Prentice-Hall, 1969, 4 Cover Sheets (unnumbered), and p. 89.

Wolf, "Silicon Processing for the VLSI Era, vol. 2: Process Integration", Lattice Press, 1990, 2 Cover Sheets (unnumbered), pp. 66-69.

Zhou et al., "A Fully Integrated CMOS 900MHz LNA Utilizing Monolithic Transformers", IEEE International Conference on Solid-State Circuits, Feb. 5-7, 1998, Digest of Technical Papers, pp. 132-133.

Zhou et al., "Monolithic Transformers and Their Application in a Differential CMOS RF Low-Noise Amplifier", IEEE Journal of Solid State Circuits, vol. 33, No. 12, Dec. 1998, pp. 2020-2027.

Gupta et al., "Asymmetric Cross-Coupled Differential Pair Configuration to Realize Neuron Activation Function and Its Derivative", IEEE Transactions on Circuits and Systems II: Express Briefs, vol. 52, No. 1, Jan. 2005, pp. 10-13.

Partial European Search Report dated Feb. 9, 2016, in European Application No. 15183918.0 (8 pages).

Partial European Search Report dated Feb. 9, 2016, in European Application No. 15183914.9 (9 pages).

Der et al. "A Switched-Capacitor Differencing Circuit with Common-Mode Rejection for Fully Differential Comparators," Proceedings of the 36th Midwest Symposium on Circuits and Systems, Aug. 1993, vol. 2, pp. 911-914.

EP 15183918.0, dated Jul. 1, 2016, Extended European Search Report.

EP 15183914.9, dated May 23, 2016, Extended European Search Report.

EP 16154322.8, dated Feb. 16, 2017, Extended European Search Report.

Extended European Search Report dated May 23, 2016 for Application No. EP 15183914.9.

Extended European Search Report dated Feb. 16, 2017 for Application No. EP 16154322.8.

(56) References Cited

OTHER PUBLICATIONS

Lu et al., A Rail-To-Rail Class-AB Amplifier With an Offset Cancellation for LCD Drivers. IEEE J Solid-State Circ. Feb. 2009;44(2):525-37.
Extended European Search Report dated Jul. 1, 2016 in connection with European Application No. 5183918.0.
German Examination Report dated Jun. 21, 2017 and partial English translation thereof in connection with German Application No. 102015118514.8.
Japanese Office Action dated Oct. 7, 2016 and English translation thereof for Japanese Application No. 2015-215569.

\* cited by examiner

100

300

200

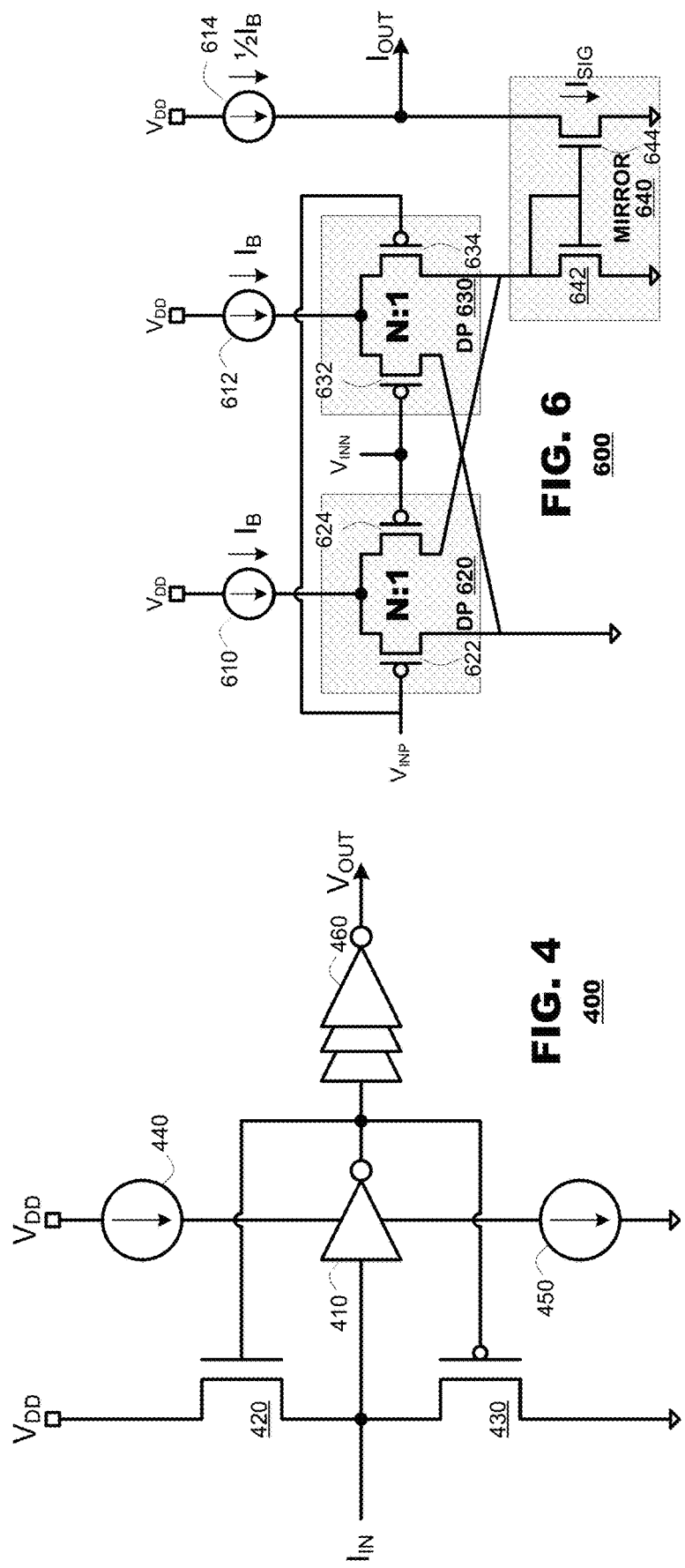

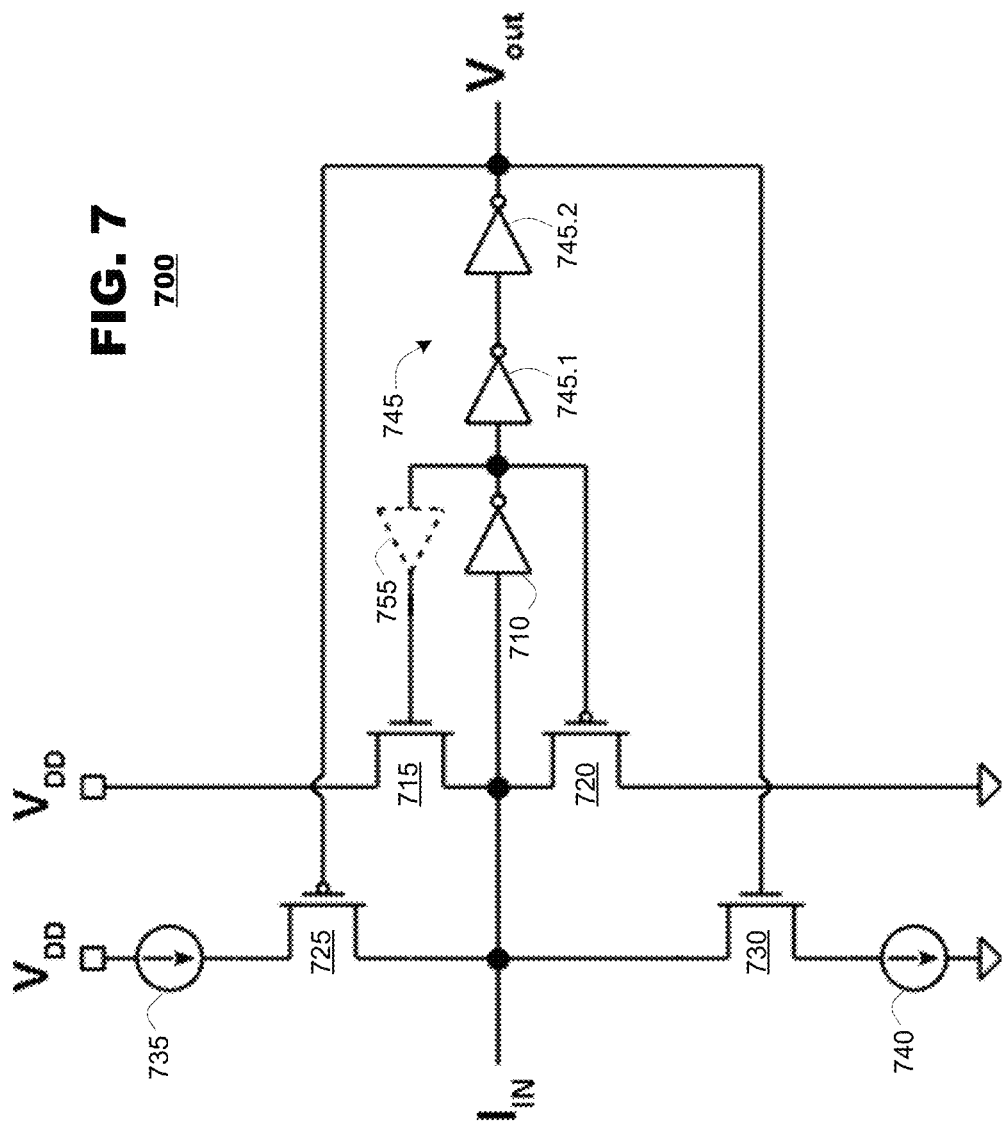

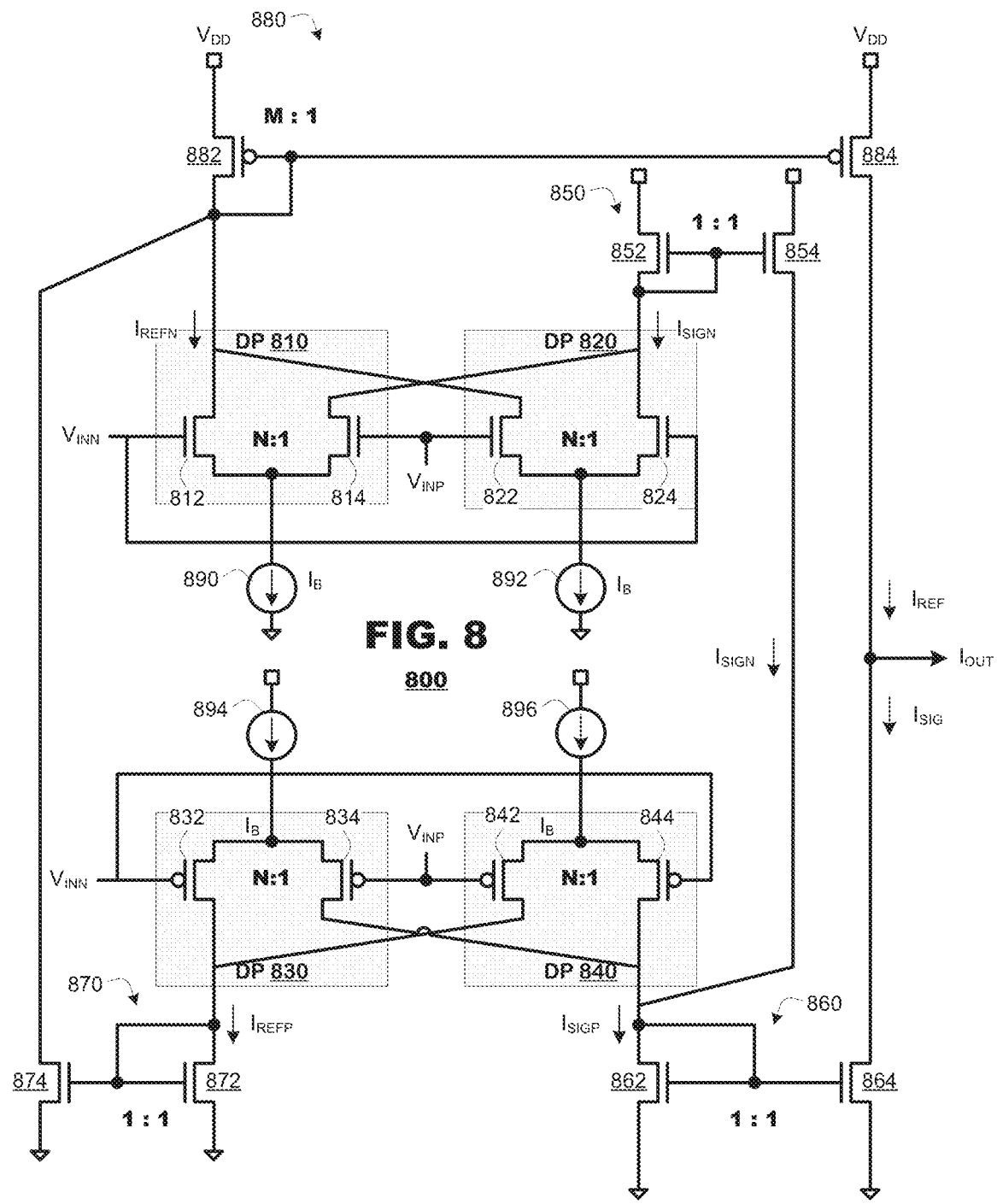

900 ized by the present invention. The system 100 may include a transmitter 110, an isolator 120, a receiver 130 and
DEMODULATION OF ON-OFF-KEY MODULATED SIGNALS IN SIGNAL ISOLATOR SYSTEMS

RELATED APPLICATIONS

This application is a continuation-in-part of U.S. application Ser. No. 14/486,951, filed Sep. 15, 2014, the disclosure of which is incorporated herein by reference.

BACKGROUND

The present invention relates to signal isolators and, particularly, signal isolators that operate according to an on-off keyed signal protocol.

Isolators are devices that exchange data signals between two galvanically isolated circuit systems. The two circuit systems each operate in different voltage domains, which may include different supply voltages and different ground references. Isolation devices may provide data exchange across an isolation barrier, which maintains the galvanic isolation. Typical isolation devices include micro-transformers, capacitors, magneto-resistors/giant magneto-resistors and opto-electronic devices.

On-off keying ("OOK") is a signaling protocol that identifies a digital state of input data based on the type of signal that is transmitted through the isolation barrier. A first digital data state (say, a digital "1") might be signaled by transmitting a periodic signal across the isolation barrier. A second digital data state (a digital "0") might be signaled by transmitting no signal across the isolation barrier. A receiver circuit would detect the presence or absence of the periodic signal and decode a digital output signal therefrom.

OOK-based signal isolators typically have inefficient designs. For example, isolator receivers may include a multiplier (or mixer) and an integrator as an energy detector for OOK demodulation. A mixer, however, has a limited ability to handle common mode noise. Integrators typically are very slow for applications that require high data rate transmission across the isolation barrier.

Accordingly, the inventors perceive a need in the art for an improved receiver that provides improved speed and improved noise immunity.

BRIEF DESCRIPTION OF THE DRAWINGS

FIG. 4 illustrates a current comparator according to an embodiment of the present invention.

FIG. 5 illustrates exemplary signals that may be processed by the comparator of FIG. 4.

FIG. 6 illustrates a receiver according to another embodiment of the present invention.

FIG. 7 illustrates an output driver according to another embodiment of the present invention.

FIG. 8 illustrates a receiver according to another embodiment of the present invention.

DETAILED DESCRIPTION

Embodiments of the present invention provide a receiver system for an on-off key isolator system. The system may include a receiver that generates an intermediate current signal based on an OOK input signal. The intermediate current may be provided at a first current level when the input signal has a first OOK state and a second current level when the input signal has a second OOK state. The system also may include an output driver to generate a voltage representation of the intermediate current signal. Performing signal processing in a current domain permits fast transitions between OOK states.

In another embodiment, a receiver system for an OOK isolator system may include a pair of receivers. A first receiver may generate a first current signal representing a received OOK signal, and a second receiver may generate a second current signal from a common mode representation of the received OOK signal. The receiver system may include circuitry to compare the first and second current signals and generate an output signal therefrom.

Figure 1:
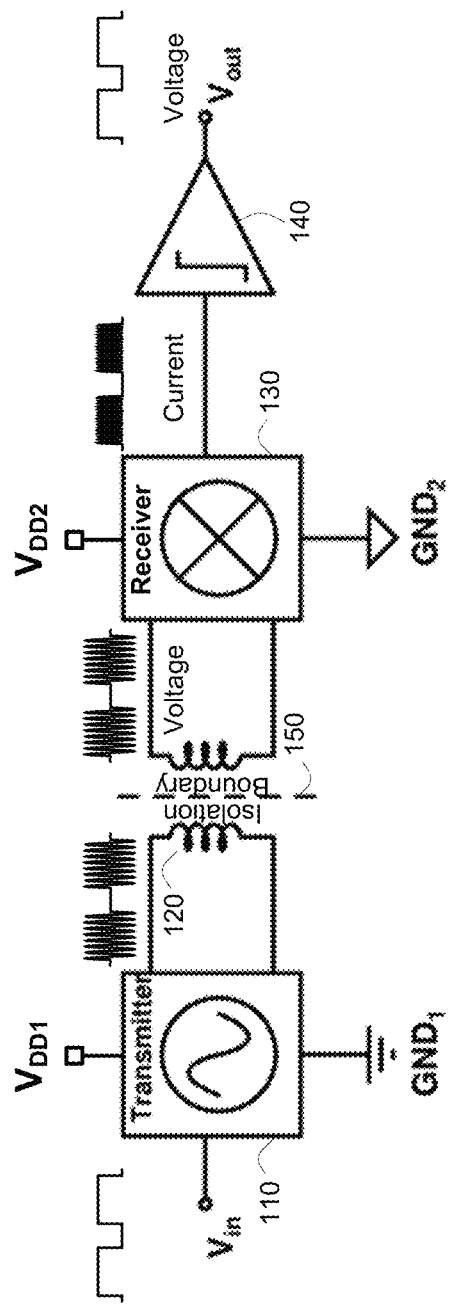
FIG. 1 illustrates an isolator system according to an embodiment of the present invention.

FIG. 1 illustrates an isolator system 100 according to an embodiment of the present invention. The system 100 may include a transmitter 110, an isolator 120, a receiver 130 and an output driver 140. The isolator 120 may span an isolation boundary 150, which galvanically isolates two voltage domains from each other. The transmitter 110 may belong to a first voltage domain, which possesses its own voltage and ground supplies (shown as $V_{DD1}$, $GND_1$). The receiver 130 and output driver 140 may belong to a second voltage domain, which possesses voltage and ground supplies ($V_{DD2}$, $GND_2$) separate from the supplies of the first voltage domain. The isolation boundary 150 may prevent communication of voltages from one domain to the other.

The system 100 may be provided for communication of digital data from the first voltage domain to the second voltage domain by on-off keying ("OOK" for short). In such an embodiment, the transmitter 110 may receive an input signal that takes one of two binary voltage levels. The transmitter 110 may generate an output signal having a state that is determined from the state of the input signal. For example, if the input signal corresponds to a binary value of "1," the transmitter 110 may generate a periodic signal as its output but, if the input signal corresponds to a binary value of "0," the transmitter 110 may output an inert signal (no activity). This action of toggling between an active state and an inactive state based on the state of the input signal represents one example of an on-off keyed output.

The isolator 120 may be provided as a micro-transformer (shown in FIG. 1), capacitive isolators, magneto-resistive sensors, an optical signal isolator or as Hall effect devices. The isolator 120 may receive the output from the transmitter 110 in the first voltage domain and pass a received signal to the receiver 130 in the second voltage domain. Although the received signal is illustrated as a copy of the OOK output that the isolator 120 receives from the transmitter 110, the received signal may include perturbations (not illustrated) that are induced into the signal by the isolator 120, for example, shifts in voltage, distortions induced by the isolator's temporal response and noise effects. The received signal may be provided to the receiver 130 as a voltage.

The receiver 130 and output driver 140 may form an OOK receiver system in aggregate. The receiver 130 may generate a current signal from the OOK signal supplied to it by the isolator 120. The output driver 140 may generate a voltage signal from the current signal supplied to it by the receiver 130. In an embodiment, the receiver 130 and output driver 140 may exchange current domain signals to provide a low latency output in response to OOK signals provided by the isolator 120.

Figure 2:
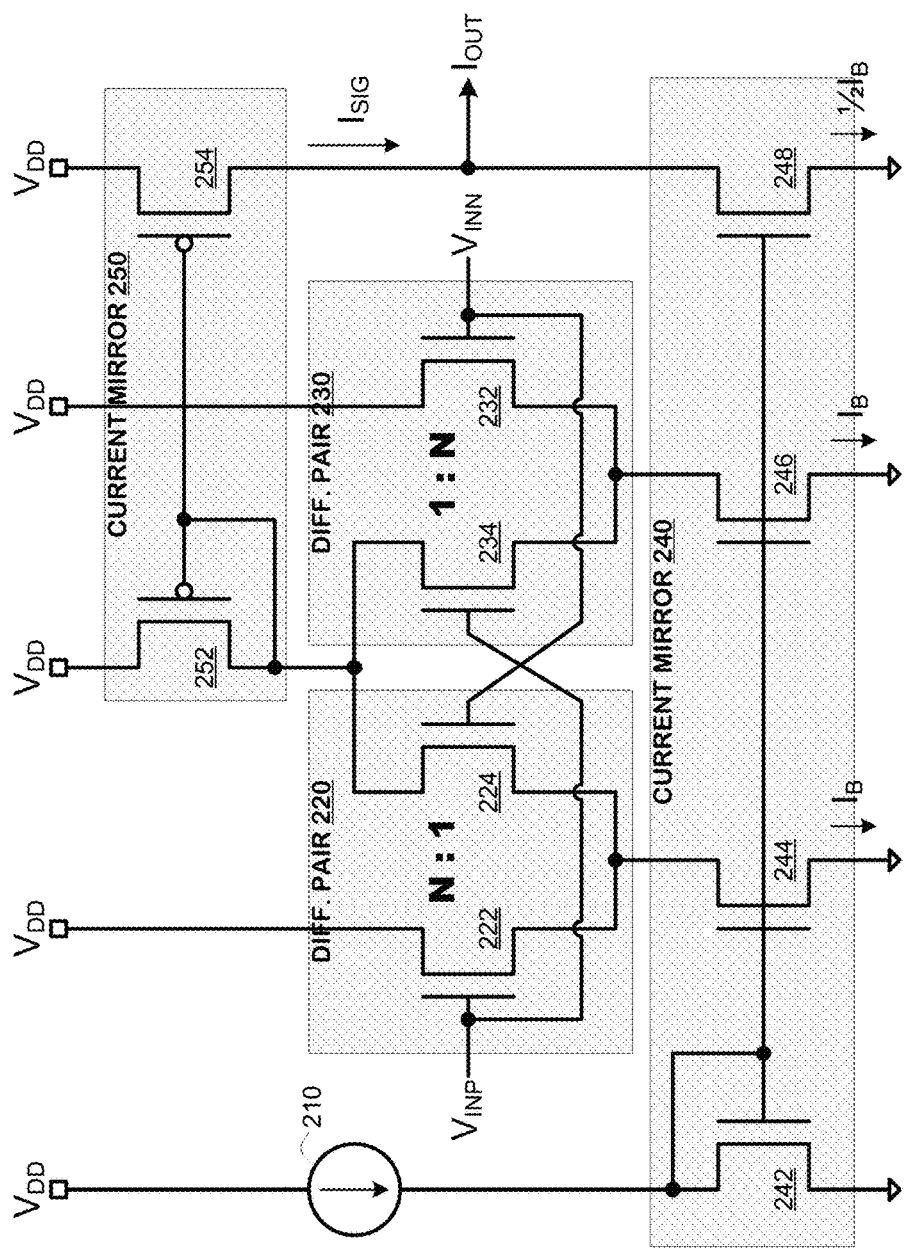
FIG. 2 illustrates a receiver according to an embodiment of the present invention.

FIG. 2 illustrates a receiver 200 according to an embodiment of the present invention, which may be employed as a receiver in the system of FIG. 1. The receiver 200 may include a current source 210, two differential pair circuits 220, 230 and a pair of current mirrors 240, 250.

The differential pair circuits 220, 230 each may include a pair of mismatched transistors 222, 224 for pair 220 and 232, 234 for pair 230. The transistors in each pair 220, 230 may be mismatched according to a predetermined sizing ratio, shown as N to 1. Thus, transistors 222 and 232 may be N times larger than their counterpart transistors 224 and 234. During operation, in response to a common control voltage, the transistors 222, 232 may pass N times more current than the counterpart transistors 224 and 234.

The input signal $V_{IN}$ may be a differential signal represented by component signals $V_{INN}$ and $V_{INP}$. Gates of transistors 222 and 234 may receive a first input voltage $V_{INP}$ and gates of the other transistors 224 and 232 may receive a second input voltage $V_{INN}$. Sources of the transistors 222, 224 in the first differential pair 220 may be connected to a common node, which may be coupled to a transistor 244 within the current mirror 240. Sources of the transistors 232, 234 in the second differential pair 230 may be connected to a second node, which may be coupled to another transistor 246 within the current mirror 240. Drains of the unit-sized transistors 224, 234 of the two differential pairs 220, 230 may be connected together and connected to a first transistor 252 in the second current mirror 250. Drains of the N-sized transistors 222, 232 of the two differential pairs 220, 230 may be connected to voltage supplies $V_{DD}$.

The first current mirror 240 may include a plurality of transistors 242-248 whose gates are connected together. The first transistor 242 may be connected to the current source 210 at its drain. The first transistor 242 also may be configured in a diode-connected configuration. Thus, an amount of current that passes through the first transistor 242 (which is defined by the current source 210) defines the amount of current that passes through the remaining transistors 244-248 of the current mirror 240. The transistors 244-248 may be sized so that twice as much current passes through transistors 244 and 246 as passes through transistor 248 (shown as $I_B$ and $\frac{1}{2}I_B$, respectively).

The second current mirror 250 may include a pair of transistors 252 and 254. As discussed, a first transistor 252 may be connected to the unit-sized transistors 224 and 234 of the differential pairs 220, 230. The second transistor 254 may be connected to the transistor 248 in the first current mirror 240. The first transistor 252 may be provided in a diode-connected configuration. Thus, the current that passes through transistor 252 defines an amount of current that passes through transistor 254.

An output terminal $I_{OUT}$ of the receiver 200 may be provided at the connection between transistors 254 and 248. During operation, the transistors 254 and 248 perform a current comparison at the output terminal $I_{OUT}$. The transistor 248 may sink an amount of current from the output terminal equal to $\frac{1}{2}I_B$. The transistor 254 may source an amount of current $I_{SIG}$ to the output terminal in an amount that is determined by the differential pairs 220, 230, which in turn is determined by the input signals $V_{INP}$ and $V_{INN}$. When $I_{SIG} \neq \frac{1}{2}I_B$, a residual current is either sourced to or sunk from the output terminal $I_{OUT}$.

In the embodiment illustrated in FIG. 2, the transistors are illustrated as MOSFET transistors and, specifically, transistors 222-224, 232-234 and 242-248 are illustrated as NMOS transistors and transistors 252-254 are illustrated as PMOS transistors. The principles of the present invention apply to transistors of other process technologies, such as BJT transistors and the like. Moreover, as discussed hereinbelow, process types may be inverted (e.g., PMOS transistors may be provided where NMOS transistors are illustrated and NMOS transistors may be provided where PMOS transistors are illustrated) with appropriate inversion of supply voltages. Such variations are immaterial to the principles of the present invention unless mentioned herein.

Figure 3:
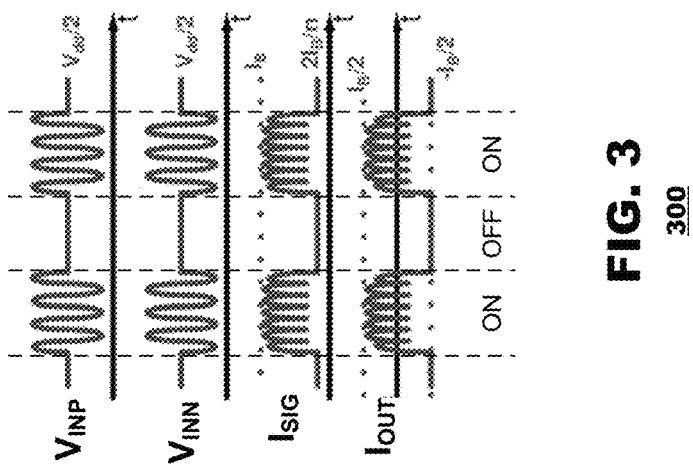
FIG. 3 illustrates exemplary signals that may be processed by the receiver of FIG. 2.

FIG. 3 illustrates exemplary input and output signals that may be processed by the receiver of FIG. 2. The input signals $V_{INP}$ and $V_{INN}$ may toggle between two phases of operation according to the OOK signal structure of the system. In a first phase of operation, the OOK signal may be in an "OFF" state in which $V_{INP}$ and $V_{INN}$ are inactive signals. As shown in FIG. 3, $V_{INP}$ and $V_{INN}$ each have voltages of $\frac{1}{2}V_{DD}$. In the second phase of operation, the OOK signal may be in an "ON" state in which $V_{INP}$ and $V_{INN}$ are active signals. In the example of FIG. 3, the $V_{INP}$ and $V_{INN}$ signals oscillate between $V_{DD}$ and ground, centered about $\frac{1}{2}V_{DD}$. In practice, $V_{INP}$ and $V_{INN}$ may not be full rail signals (e.g., transitioning fully to ground or to $V_{DD}$) owing to losses within the circuit system.

During the OFF state, when $V_{INP}$ and $V_{INN}$ are set to $\frac{1}{2}V_{DD}$, the transistors 222, 224, 232, 234 of the differential pairs 220, 230 may become partially conductive. The transistors 222, 232 may source N times as much current to their respective transistors 244, 246 in the current mirror 240 than the transistors 224, 234 do. The current mirror transistors 244, 246 each govern current through the differential pairs 220, 230, limiting the total current through each pair 220, 230 to $I_B$. Thus, transistors 224 and 234 each pass current in the amount of $$\frac{1}{N+1}I_B$$

and the transistors 222, 232 each pass the remainder of the current $$\frac{N}{N+1}I_B.$$

In the second current mirror 250, the transistor 252 may source the current that passes through the unit-sized transistors 224, 234. Thus, transistor 252 may pass current in an amount of $$\frac{2}{N+1}I_B.$$

This current may be replicated in transistor $$254\left(I_{SIG} = \frac{2}{N+1}I_B\right).$$

The $I_{SIG}$ current may be compared to the current ($\frac{1}{2}I_B$) that is drained from the output terminal by transistor 248. Thus, the output current may be represented as $$I_{OUT} = \frac{2}{N+1}I_B - \frac{1}{2}I_B.$$

When N is sufficiently large (e.g., N≥10), these equations may simplify to:

$$I_{SIG} = \frac{2}{N}I_B,$$

and $$I_{OUT} = -\frac{1}{2}I_B.$$

During the ON state, $V_{INP}$ and $V_{INN}$ may oscillate between $V_{DD}$ and ground. Conductivity of the transistors 222, 224, 232, 234 of the differential pairs 220, 230 may vary according to these signals. When $V_{INP}$ is at its maximum level, for example, transistors 222 and 234 may be nearly fully conductive. At this same time, $V_{INN}$ will be at its minimum level, which may render transistors 224 and 232 minimally conductive. Thus, transistors 222 and 234 each may pass nearly all of the current ($I_B$) that their associated current mirror transistors 244 and 246 sink. The current passed by transistor 224 may be sourced by transistor 252 in the second current mirror. Thus, the second transistor 254 in the second current mirror 250 may generate a current $I_{SIG}$ at $I_B$.

Similarly, when $V_{INN}$ is at its maximum level, for example, then transistors 232 and 224 may be nearly fully conductive. At this same time, $V_{INP}$ will be at its minimum level, which may render transistors 222 and 234 minimally conductive. Thus, transistors 224 and 232 each may pass nearly all of the current ($I_B$) that their associated current mirror transistors 244 and 246 sink. The current passed by transistor 234 may be sourced by transistor 252 in the second current mirror. Thus, the second transistor 254 in the second current mirror 250 may generate a current $I_{SIG}$ at $I_B$.

Overall, during the ON phase, the $I_{SIG}$ current may vary in response to the $V_{INP}$ and $V_{INN}$ input signals as shown in FIG. 3. The $I_{SIG}$ current may be compared to the ½$I_B$ current that is sunk from the output terminal by the current mirror transistor 248. Thus, the receiver of FIG. 2 may generate an output current $I_{OUT}$ having the form illustrated in FIG. 3.

FIG. 4 illustrates a current comparator 400 according to an embodiment of the present invention. The comparator 400 may include an inverter 410, a pair of pulling transistors 420, 430, current sources 440 and 450 and one or more inverters 460. The inverter 410 may accept a current input $I_{IN}$ on an input terminal. The input current may be an output current $I_{OUT}$ generated by a receiver such as those described in FIGS. 1, 2, 6 and 8 of this disclosure.

The input terminal $I_{IN}$ also may be connected to a first supply voltage $V_{DD}$ by a first transistor 420 and to a second supply voltage (shown as ground) by a second transistor 430. Gates of the transistors 420, 430 may be coupled to an output of the inverter 410. The transistors 420, 430 may provide a positive feedback control within the comparator 400 to pull an input signal in the direction of one of the supplies $V_{DD}$ or ground as the input current $I_{IN}$ drives the inverter's input in that direction.

The inverter 410 may be connected to the supply voltages $V_{DD}$ and ground by respective current sources 440, 450. During operation, the current sources 440, 450 may limit responsiveness of the inverter 410 to transitions in the input current signal $I_{IN}$, which helps to filter signal glitches and other transients that otherwise might by introduced by noise within the system.

The inverter(s) 460 may buffer a voltage output provided by the inverter 410. The inverters 460 may include filters or other signal conditioning circuits (not shown) to filter transients from the inverter's output. A voltage $V_{OUT}$ output from the inverters 460 may be output from the isolator system as a digital output signal.

FIG. 5 illustrates exemplary input and output signals that may be processed by the comparator 400 of FIG. 4. In FIG. 5, the input current $I_{IN}$ is shown as the output current signal $I_{OUT}$ in FIG. 3. The output signal generated from the input current $I_{IN}$ is shown as $V_{OUT}$.

FIG. 6 illustrates a receiver 600 according to another embodiment of the present invention. The receiver 600 may include a plurality of current sources 610, 612, 614, two differential pair circuits 620, 630 and a current mirror 640. The current sources 610 and 612 may supply currents to an associated differential pair circuit 620 or 630 at a first level $I_B$. The current source 614 may source current to an output terminal $I_{OUT}$ at a level that is half the level of current sources 610 and 620 (e.g., ½$I_B$).

The differential pair circuits 620, 630 each may include a pair of mismatched transistors 622, 624 for differential pair circuit 620 and 632, 634 for differential pair circuit 630. The transistors in each pair 620, 630 may be mismatched according to a predetermined sizing ratio, shown as N to 1. Thus, transistors 622 and 632 may be N times larger than their counterpart transistors 624 and 634. During operation, in response to a common control voltage, the transistors 622, 632 may pass N times more current than the counterpart transistors 624 and 634.

The input signal $V_{IN}$ may be a differential signal represented by component signals $V_{INN}$ and $V_{INP}$. Gates of transistors 622 and 634 may receive a first input voltage $V_{INP}$ and gates of the other transistors 624 and 632 may receive a second input voltage $V_{INN}$. Sources of the transistors 622, 624 in the first differential pair circuit 620 may be connected to a common node, which may be coupled to current source 610. Sources of the transistors 632, 634 in the second differential pair 630 may be connected to a second node, which may be coupled to another current source 620. Drains of the unit-sized transistors 624, 634 of the two differential pair circuits 620, 630 may be connected together and connected to a first transistor 642 in the second current mirror 640. Drains of the N-sized transistors 622, 632 of the two differential pair circuits 620, 630 may be connected to a voltage supply (ground, in this case).

The current mirror 640 may include a pair of transistors 642 and 644. As discussed, a first transistor 642 may be connected to the unit-sized transistors 624 and 634 of the differential pairs 620, 630. The second transistor 644 may be connected to the current source 614. The first transistor 642 may be provided in a diode-connected configuration. Thus, the current that passes through transistor 642 defines an amount of current that passes through transistor 644.

An output terminal $I_{OUT}$ of the receiver 600 may be provided at the connection between transistors 644 and current source 614. During operation, the transistor 644 and current source 614 perform a current comparison at the output terminal $I_{OUT}$. The current source 614 may source an amount of current to the output terminal equal to ½$I_B$. The transistor 644 may sink an amount of current $I_{SIG}$ from the output terminal $I_{OUT}$ in an amount that is determined by the differential pair circuits 620, 630, which in turn is determined by the input signals $V_{INP}$ and $V_{INN}$. When $I_{SIG} \neq \frac{1}{2}I_B$, a residual current is either sourced to or sunk from the output terminal $I_{OUT}$.

The circuit of FIG. 6 may operate in accordance with the principles discussed above with respect to FIG. 3. Here, the transistors 622-624, 632-634 of the differential pairs 620, 630 are illustrated as PMOS transistors rather than NMOS transistors as illustrated in FIG. 2 and, therefore, the conductivity of the transistors will be inverted from that of the FIG. 2 circuit during the ON phase. Nevertheless, the circuit of FIG. 6 may generate a signal current $I_{SIG}$ as illustrated in FIG. 3, which may be compared to the current $\frac{1}{2}I_B$ of the current source 614 to generate the $I_{OUT}$ signal, also illustrated in FIG. 3.

FIG. 7 illustrates an output driver 700 according to another embodiment of the present invention. The output driver 700 may include an inverter 710, a pair of pulling transistors 715, 720, a pair of gating transistors 725, 730, a pair of current sources 735, 740 and one or more output inverters 745. An input current signal $I_{IN}$ may be input to an input of the inverter 710.

The pulling transistors 715, 720 may couple the input terminal $I_{IN}$ to respective high and low voltage supplies $V_{DD}$ and ground. Gates of the pulling transistors 715, 720 may be coupled to an output of the inverter 710.

The gating transistors 725 and 730 and current sources 735, 740 may be provided in pairs. A first transistor-current source pair 725, 735 may provide a second circuit path between the input terminal $I_{IN}$ and the high voltage supply $V_{DD}$ in parallel to a circuit path provided by the first pulling transistor 715. A second transistor-current source pair 730, 740 may provide a circuit path between the input terminal $I_{IN}$ and the low voltage supply (ground) in parallel to a circuit path that is provided by the second pulling transistor 720. The gating transistors and pulling transistors may be provided as complementary device types. In the example illustrated in FIG. 7, the first pulling transistor 715 is illustrated as an NMOS transistor and the first gating transistor 725 is illustrated as a PMOS transistor. Further, the second pulling transistor 720 is illustrated as a PMOS transistor and the second gating transistor 730 is illustrated as an NMOS transistor. Optionally, a buffer 755 may be provided in a circuit path from the inverter output chain to a gate of transistor 715.

Although the current sources 735, 740 are illustrated as ideal current sources, their operation may be gated by their associated transistors 725 and 730. Thus, current source 735 will not supply current when its associated transistor 725 is rendered non-conductive. Similarly, current source 740 will not drive current when its associated transistor 730 is non-conductive. Gates of the gating transistors 725, 730 may be coupled to a node after one of the inverters 745. The provision of current sources 735 and 740 adds a hysteresis effect to operation of the output driver 700 which reduces its sensitivity to noise and other short term transients in the input current $I_{IN}$.

The output driver 700 may include one or more output inverters 745. Two output inverters 745.1, 745.2 are illustrated in FIG. 7 although different implementations may include other numbers of inverters as may be desired. Increasing the number of inverters may increase the driver's resistance to transients in the input current signal but also may increase the latency of the driver's response to key changes in the input signal.

During operation, an input current $I_{IN}$ may be presented to the inverter 710, in the form illustrated in FIG. 3. Responsive to the input voltage, the inverter 710 may generate an output voltage at one of two levels, $V_{DD}$ or ground. The inverter's output may be input to the transistors 715-730. When the inverter's output is set to $V_{DD}$, the transistor 715 may become conductive, which allows the input current to pass to $V_{DD}$. The transistor 715 may be sized to weakly pull the input node to $V_{DD}$ as compared to pulls exerted by the inverter 710. When the inverter's output is set to ground, the transistor 720 may become conductive, which allows the input current to pass to ground. The transistor 720 also may be sized to weakly pull the input node to ground as compared to pulls exerted by the inverter 710.

FIG. 8 illustrates a receiver circuit 800 according to another embodiment of the present invention. There, the receiver 800 may include four differential pair circuits 810-840, several current mirrors 850-880, and a plurality of current sources 890-896. The differential pair circuits 810-840 each may include a pair of mismatched transistors, shown as having a ratio of N to 1. Two differential pair circuits 810, 820 may have transistors 812, 814, 822 and 824 of a first doping type (NMOS transistors, in the example illustrated in FIG. 8) and the other two differential circuits 830, 840 may have transistors 832, 834, 842, 844 of a complementary doping type (e.g., PMOS transistors, in this example). Tails of each of the differential pair circuits 810-840 may be connected to respective current sources 890-896.

The current mirrors 850-880 may be arranged to sum currents that pass through the N-sized transistors 812, 822, 832 and 842 and those that pass through the unit-sized transistors 814, 824, 834, 844. Current mirror 850, for example, may have a first leg, provided by transistor 852, that is coupled to the unit-sized transistors 814, 824 of differential pairs 810 and 820 and a second leg, provided by transistor 854 for an output current $ISIG_N$. The transistor 852 may be provided in a diode-connected configuration. Thus, an amount of current passed by the unit-sized transistors 814, 824 of the two differential pairs may be output to the second leg of the current mirror, also shown as $ISIG_N$.

The current mirror 860 may have a first leg, provided by transistor 862, that is coupled to the unit-sized transistors 834, 844 of differential pairs 830 and 840 and also to the output leg of current mirror 850. A second leg of the current mirror 860, provided by transistor 864, may be coupled to the output terminal $I_{OUT}$. The transistor 862 may be provided in a diode-connected configuration. Thus, the current mirror 860 may generate a current signal ISIG representing a sum between $ISIG_N$ and the current passed by the unit-sized transistors 834, 844 of the second pair of differential pair circuits 830, 840.

Similarly, current mirror 870 may have a first leg, provided by transistor 872, that is coupled to the N-sized transistors 832, 842 of differential pairs 830 and 840 and a second leg, provided by transistor 874 for an output current $IREF_P$. The transistor 874 may be provided in a diode-connected configuration. Thus, an amount of current passed by the N-sized transistors 832, 842 of the differential pairs 830 and 840 may be output to the second leg of the current mirror, also shown as $IREF_P$.

The current mirror 880 may have a first leg, provided by transistor 862, that is coupled to the N-sized transistors 812, 824 of differential pairs 810 and 820 and also to the output leg of current mirror 870. A second leg of the current mirror 880, provided by transistor 884, may be coupled to the output terminal $I_{OUT}$. The transistor 882 may be provided in a diode-connected configuration. Thus, the current mirror 880 may generate a current signal IREF representing a sum between IREF and the current passed by the N-sized transistors 812, 822 of the second pair of differential pair circuits 810, 820.

In an embodiment, the transistors 882, 884 of current mirror 880 may be mismatched transistors with transistor 882 being larger than transistor 884 (shown as being M times larger). In such an embodiment, the transistor 882 would pass M times the current that transistor 884 passes. In other words, the current $I_{REF}$ would be to $1/M^{th}$ the current that passes through the N-sized transistors 812, 822, 832 and 842 of the differential pair circuits 810, 820, 830 and 840.

The output terminal $I_{OUT}$ of the receiver 800 may be provided at the connection between transistors 884 and 864. During operation, the current mirrors 860 and 880 may perform a current comparison at the output terminal $I_{OUT}$. The transistor 864 may sink an amount of current $I_{SIG}$ from the output terminal $I_{OUT}$ based on the amount of current sunk by the unit-sized transistors 814, 824, 834, 844 of the differential pair circuits 810, 820, 830 and 840. The transistor 884 may source an amount of current $I_{REF}$ to the output terminal $I_{OUT}$ based on the amount of current sunk by the N-sized transistors 812, 822, 832 and 842 of the differential pair circuits 810, 820, 830 and 840. When $I_{REF} \neq I_{SIG}$, a residual amount of current either would be sourced output from the receiver 800 or sunk by the receiver 800 through the $I_{OUT}$ terminal.

During operation, the input signals $V_{INP}$ and $V_{INN}$ may toggle between two phases of operation according to the OOK signal structure of the system. In a first phase of operation, the OOK signal may be in an "OFF" state in which $V_{INP}$ and $V_{INN}$ are inactive signals. During this time, $V_{INP}$ and $V_{INN}$ each may have voltages of $\frac{1}{2}V_{DD}$ which may render all transistors of the differential pair circuits 810, 820, 830 and 840 partially conductive. The N-sized transistors 812, 822, 832 and 842 may induce a reference current through the current mirror 880 as $$I_{REF} = \frac{4}{M} I_B.$$

The unit-sized transistors 814, 824, 834, 844 may induce a current through the current mirror 860 as $$I_{SIG} = \frac{4}{N} I_B.$$

When N>M, then $I_{REF}$>$I_{SIG}$ in the OFF state.

In the second phase of operation, the OOK signal may be in an "ON" state in which $V_{INP}$ and $V_{INN}$ are active signals. The $V_{INP}$ and $V_{INN}$ signals may oscillate between $V_{DD}$ and ground, centered about $\frac{1}{2}V_{DD}$. Again, $V_{INP}$ and $V_{INN}$ may not be full rail signals owing to losses within the circuit system. Conductivity of the transistors in the differential pair circuits 810, 820, 830 and 840 may vary according to these signals. The N-sized transistors 812, 822, 832 and 842 may induce a reference current as $4I_B$, which may be scaled down at the output node as $$I_{REF} = \frac{4}{M} I_B.$$

The unit-sized transistors 814, 824, 834, 844 may induce a current as $I_{SIG}=2I_B$. When M>2, then $I_{SIG}$>$I_{REF}$ in the ON state.

The parameters of N and M may be tuned to suit individual application needs. They should be set so that the current comparison at the output terminal ($I_{OUT}$) generates a first detectable state when the OOK signal is in an "OFF" state and another state when the OOK signal is in an "ON" state. Typically, M will be larger than 2.

The embodiment of FIG. 8 provides several advantages over the design shown in, for example, FIG. 2. First, by providing differential pair circuits of two process types (e.g., both PMOS and NMOS), the receiver 800 will remain responsive to input signals at both extremes of an input voltage ($V_{DD}$ and ground). Transistors of each type may be non-responsive when a difference of voltages between their gates and their sources fail to overcome a $V_{GS}$ threshold inherent to those transistors. For NMOS transistors, the gate voltage must exceed the source voltage by the $V_{GS}$ thresholds and, when such transistors connect their sources to ground, the transistors may not be responsive to an input voltage that differs from ground by less than the transistor's $V_{GS}$ threshold. Similarly, for PMOS transistors, the gate voltage must be less than the source voltage by the $V_{GS}$ threshold and, when such transistors connect their sources to $V_{DD}$, the transistors may not be responsive to an input voltage that differs from $V_{DD}$ by less than the transistor's $V_{GS}$ threshold. In the circuit of FIG. 8, however, if the differential pairs of one doping type (say, those having the PMOS transistors) are non-responsive, the differential pairs of the complementary doping type may continue operation. Thus, the design of FIG. 8 may provide for rail-to-rail operation.

Further, the design of FIG. 8 may conserve resources as compared to the design of FIG. 2. Whereas, in the FIG. 2 embodiment, current that passes through the N-sized transistors was sourced to the supplies ($V_{DD}$ and ground), in the FIG. 8 embodiment the currents that are used in both the N-sized transistors and the unit-sized transistors are used to drive their respective current mirrors. Thus, the FIG. 8 embodiment may provide for more efficient use of resources.

Figure 9:
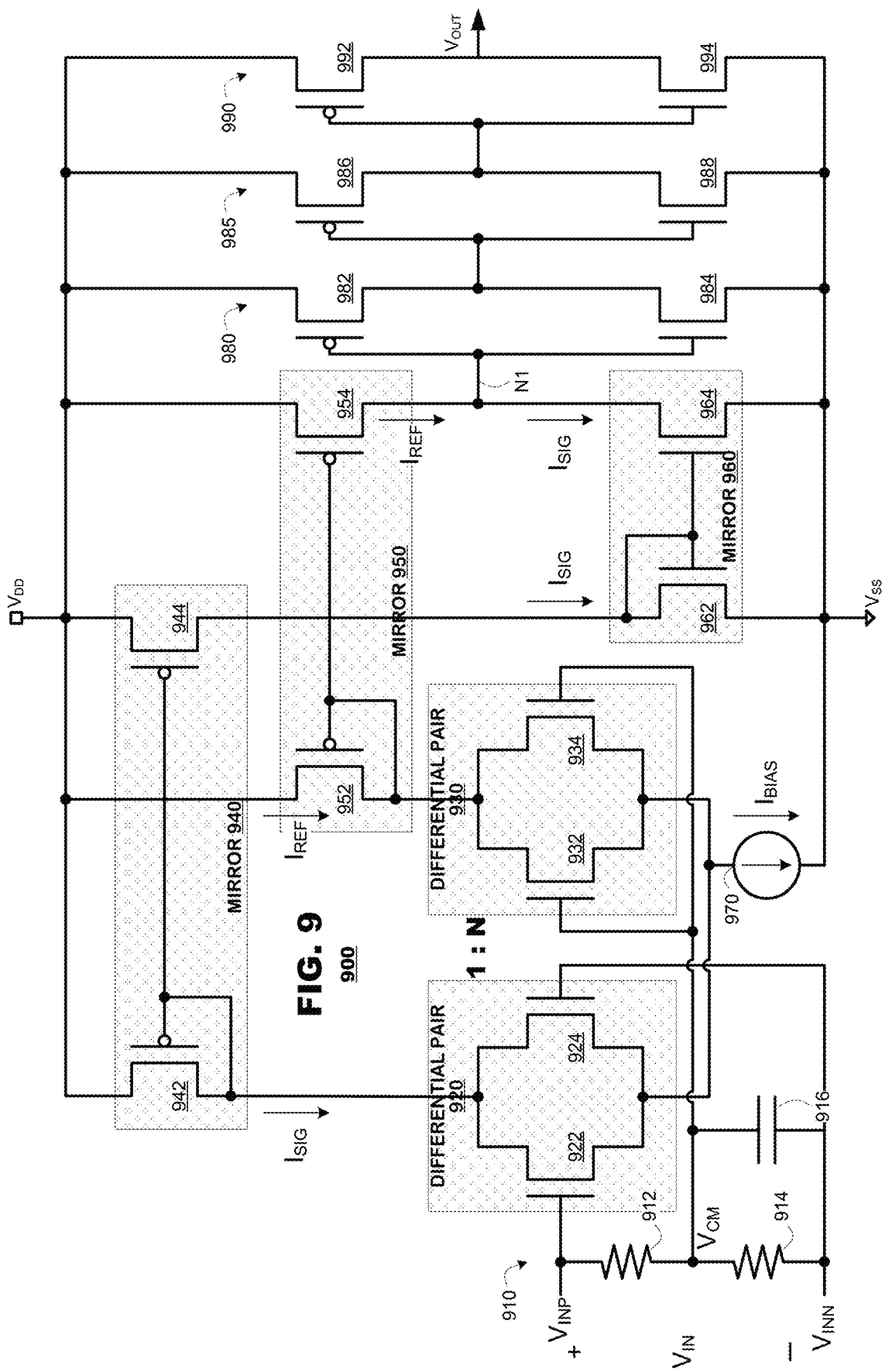
FIG. 9 illustrates a receiver according to a further embodiment of the present invention.

FIG. 9 illustrates a receiver 900 according to another embodiment of the present invention, which may be employed as a receiver in the system of FIG. 1. The receiver 900 may include a filter 910, two differential pair circuits 920, 930 current mirrors 940-960, a bias current source 970, and one or more output stages 980-990. The receiver 900 may accept a differential input signal $V_{IN}$ that is represented by component signals $V_{INN}$ and $V_{INP}$. The filter 910 is connected between inputs of the differential voltage source; it may generate a common mode voltage $V_{CM}$ between $V_{INN}$ and $V_{INP}$. The component signals $V_{INN}$ and $V_{INP}$ may be input to respective input terminals of a first differential pair circuit 920 and the common mode voltage may be input to both input terminals of a second differential pair circuit 930. The current mirrors 940-960 and output stages 980-990 may generate an output signal ($V_{OUT}$) from a comparison of currents drawn by the differential pair circuits 920, 930.

In an embodiment, the filter 910 may be an RC filter formed by bridging resistors 912, 914 and a capacitor 916. The RC filter 910 may reproduce the common mode voltage $V_{CM}$ of $V_{INN}/V_{INP}$. In this manner, the filter 910 may output a $V_{CM}$ signal that is nearly constant. Although the filter 910 is illustrated as formed of resistors 912 and 914, other components may be used. For example, the filter 910 may be formed of transistors (not shown) which are set to predetermined conductivity by application of bias voltages to their gates. The filter 910 may filter the common mode voltage $V_{CM}$ to suppress transients that may arise from electromagnetic events in an environment in which the isolator system 100 (FIG. 1) is to be used. Resistance and capacitance values of the RC filter may be selected to define a cut off frequency of the RC filter 910 that is much smaller than the carrier frequency. Circuit designers may size the capacitor 916 and resistors 912, 914 according to EMI transients that are expected to occur.

The differential pair circuits 920, 930 may be mismatched. In this embodiment, a mismatch ratio (1:N) may defined between the differential pair circuits 920, 930. Thus, transistors 922, 924 of the first differential pair circuit 920 may have a ratio of 1 as compared to transistors 932, 934 of the second differential pair circuit 920. Thus, transistors 932, 934 may be N times larger than their counterpart transistors 922, 924. During operation, in response to a common control voltage, the transistors 932, 934 may pass N times more current than the counterpart transistors 922, 924.

As discussed, the input signal $V_{IN}$ may be a differential signal represented by component signals $V_{INN}$ and $V_{INP}$. The first differential pair circuit 920 may receive the input signal $V_{IN}$ and, thus, a gate of a first transistor 922 may receive one of the component signals $V_{INP}$ and a gate of a second transistor 924 may receive the second component signal $V_{INN}$. Drains of the transistors 922, 924 may be connected together and connected to a first transistor 942 in a first current mirror 940. Sources of the transistors 922, 924 may be connected to the bias current source 970 and to the filter 910.

In the second differential pair circuit 930, gates of the transistors 932, 934 each may receive the common mode signal VCM that is generated by the filter 910. Drains of the transistors 932, 934 may be connected together and connected to a first transistor 952 in a second current mirror 950. Sources of the transistors 932, 934 may be connected to the bias current source 970 and to the filter 910.

During operation, the differential pair circuit 920, 930 will pass an amount of current that, collectively, equals an amount of current $I_{BIAS}$ sunk by the bias current source 970. When an input signal $V_{IN}$ is close to the common mode voltage ($V_{INP} \cong V_{INN} \cong V_{CM}$), the four transistors 922, 924, 932, 934 will have approximately equal bias voltage but, owing to the larger size of the transistors 932, 934, the second differential pair circuit 930 will pass N times more current than the first differential pair circuit 920. When the input signal $V_{IN}$ is close to its limits (e.g., $|V_{INP}| \cong |V_{IN}$ $_N| \cong V_{DD}$), then one of the transistors 922, 924 in the first differential pair circuit (say, 920) will be highly conductive, another one of the transistors 924 will be non-conductive, and the transistors 932, 934 of the second differential pair circuit 930 will have intermediate conductivity. In this latter case, the first differential pair circuit 920 will pass more current than the second differential pair circuit 930. Thus, the differential pair circuits 920, 930 will sink different proportions of the bias current $I_{BIAS}$ as $V_{IN}$ varies.

The currents of the first and second differential pair circuit 920, 930 may be compared at a predetermined node N1. In the configuration illustrated in FIG. 9, the second current mirror 950 includes an output transistor 954 that is coupled between a first supply voltage (here, $V_{DD}$). Thus, the current mirror 950 attempts to replicate a current $I_{REF}$ that passes through the second differential pair circuit 930, which passes also through the first transistor 952 of the mirror 950, on a circuit path that includes the second transistor 954. The receiver 900 also includes a pair of current mirror circuits 940, 960 that attempt to replicate a current $I_{SIG}$ that passes through the first differential pair circuit 920, which passes also through the first transistor 942 of current mirror 940, on a circuit path that includes the second transistor 964 of mirror circuit 960. The first mirror 940 replicates $I_{SIG}$ at its output transistor 944, which is input to a first transistor 962 of the third current mirror 960 and is output at its second transistor 964.

Because $I_{SIG} \neq I_{REF}$ in many conditions, the current mirrors 950, 960 likely will not operate as ideal current sources in all conditions. Nevertheless, the current mirrors 950, 960 operate to compare the currents $I_{SIG}$, $I_{REF}$ from the different pair circuits 920, 930 at node N1. When $I_{REF} > I_{SIG}$, which likely will occur when $V_{INP} \cong V_{INN} \cong V_{CM}$, a voltage at node N1 likely will transition toward $V_{DD}$. When $I_{REF} < I_{SIG}$, which likely will occur when $|V_{INP}| \cong |V_{INN}| \cong V_{DD}$, a voltage at node N1 likely will transition toward $V_{SS}$. Thus, the voltage at N1 may indicate the state of an OOK signal that is input to the receiver as $V_{IN}$.

The receiver 900 may include one or more output stages 980-990 to generate a binary output signal from the voltage generated at node N1 from the comparison of $I_{SIG}$ to $I_{REF}$. In the configuration illustrated in FIG. 9, the output stages 980-990 are illustrated as pairs of transistors 982 and 984, 986 and 988, and 992 and 994 connected as inverters. The number of output stages may be tailored to fit individual circuit needs, not only to provide protection against common mode transients but also to tailor polarity of the output signal to OOK events (e.g., whether an ON state or an OFF state corresponds to a $V_{OUT}$ of "1"). In an alternative configuration, one or more of the output stages 980-990 may be provided as a Schmitt trigger circuit (not shown), which may provide an inherent hysteresis to signal transitions and provide further protection against common mode transient events. Moreover, the output stage(s) may be provisioned as shown in FIGS. 4 and/or 7.

In the embodiment of FIG. 9, the degree of mismatch between transistors 922, 924 and 932, 934 of the first and second differential pair circuits 920, 930 can be made smaller than in the embodiment illustrated in FIGS. 2, 6 and 8. In the FIG. 9 implementation, N≥2 where, as discussed in the FIG. 2 embodiment, N≥10. Thus, the FIG. 9 embodiment is expected to provide common mode transient protections using a circuit with lower manufacturing cost than the embodiment of FIG. 2.

In the embodiment illustrated in FIG. 9, the transistors are illustrated as MOSFET transistors and, specifically, transistors 922-924, 932-934, 962-964 and 984, 988 and 994 are illustrated as NMOS transistors and transistors 942-944, 952-954, 982, 986 and 992 are illustrated as PMOS transistors. The principles of the present invention apply to transistors of other process technologies, such as BJT transistors and the like. Moreover, as discussed hereinbelow, process types may be inverted (e.g., PMOS transistors may be provided where NMOS transistors are illustrated and NMOS transistors may be provided where PMOS transistors are illustrated) with appropriate inversion of supply voltages. Such variations are immaterial to the principles of the present invention unless mentioned herein.

Figure 10:
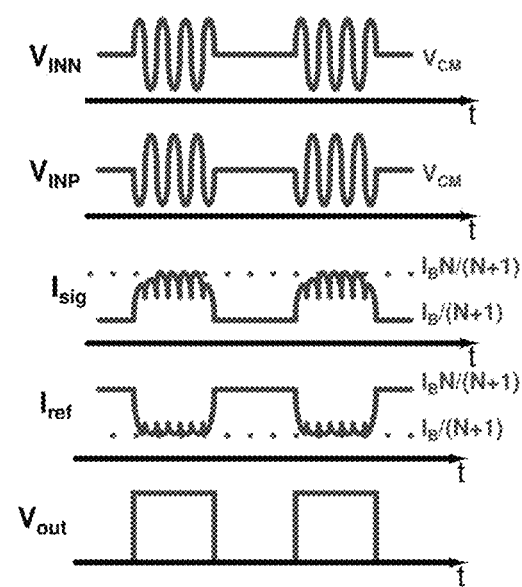
FIG. 10 illustrates exemplary signals that may be processed by the receiver of FIG. 9.

FIG. 10 illustrates exemplary signals that may be carried by the receiver 900 of FIG. 9. As illustrated, an input signal may be presented to the receiver 900 as input signal pairs $V_{INP}$ and $V_{INN}$ which are differential signals that vary about a common mode voltage $V_{CM}$. The differential pair circuits 920, 930 may generate respective $I_{SIG}$ and $I_{REF}$ current signals in response to the input signal, which are mirrored to the common node N1. Thereafter, the receiver 900 may generate an output signal $V_{OUT}$ from a comparison of the $I_{SIG}$ and $I_{REF}$ current signals.

As illustrated in FIG. 1, the receivers of the foregoing embodiments may be used cooperatively with a transmitter 110 that operates in a separate voltage domain that is isolated from a voltage domain of the receiver by an isolation boundary 150. Exemplary transmitters are illustrated in a co-pending application, filed Sep. 15, 2014, entitled "Methods and Structures to Generate On/Off Keyed Carrier Signals for Signal Isolators," Ser. No. 14/486,937, the disclosure of which is incorporated herein by reference.

The foregoing description has presented a receiver circuit for an on-off keyed signal isolator that provides fast transitions between ON and OFF states. Although the foregoing embodiments have illustrated the transmitter in the context of exemplary operations and signal protocols, the principles of the present invention are not limited to the embodiments described. For example, while MOS transistors have been illustrated herein, the principles of the present invention find application with other process technologies, for example, bipolar junction transistors and junction field effect transistors.

Several embodiments of the invention are specifically illustrated and/or described herein. However, it will be appreciated that modifications and variations of the invention are covered by the above teachings and within the purview of the appended claims without departing from the spirit and intended scope of the invention. Further variations are permissible that are consistent with the principles described above.

We claim:

1. An on-off key ("OOK") receiver system, comprising:
a first receiver that generates a first current signal representing a received OOK signal;
a second receiver that generates a second current signal based on a common mode representation of the received OOK signal,
wherein the second current signal has a magnitude that is larger than a magnitude of the first current signal when the received OOK signal is inactive; and
a current comparator to generate an output signal representing a comparison of the first and second current signals.

2. The system of claim 1, wherein the first and second receivers each comprise a respective differential pair circuit, wherein transistors of the second differential pair circuit are larger than respective transistors of the first differential pair circuit.

3. The system of claim 1, wherein:
the current comparator comprises a network of current mirrors, a first current mirror connected to the first receiver, a second current mirror connected to the second receiver;
the network has a pair of outputs coupled to a common node for the first and second current signals.

4. The system of claim 1, wherein the comparator comprises an output system to generate a binary output voltage.

5. The system of claim 4, wherein the output system includes at least one inverter on a signal path between the current comparison and the output signal.

6. The system of claim 4, wherein the output system comprises a plurality of serially-connected inverters.

7. The system of claim 4, wherein the output system includes at least a Schmitt trigger on a signal path between the current comparison and the output signal.

8. The system of claim 4, wherein the output system comprises a current-limited inverter.

9. The system of claim 4, wherein the output system comprises:
an inverter; and
a filter coupled to the inverter's output.

10. The system of claim 1, wherein the first receiver is a differential receiver having differential inputs configured to receive the OOK signal.

11. An on-off key ("OOK") receiver system, comprising:
a first receiver that generates a first current signal representing a received OOK signal;
a second receiver that generates a second current signal based on a common mode representation of the received OOK signal;
a current comparator to generate an output signal representing a comparison of the first and second current signals;
a voltage divider connected across differential inputs to the first receiver;
a pair of current routers, each coupled to a common current source, a first current router of the pair of current routers having inputs coupled to the differential inputs to the first receiver, and a second current router of the pair of current routers forming part of the second receiver and having at least one input coupled to an intermediate node of the voltage divider, wherein transistors of the second current router are larger than transistors of the first current router wherein:
the current comparator has inputs coupled to the first and second current routers and a node for comparison of currents from each of the first and second current routers; and
an output circuit having an input coupled to the node and an output for outputting a binary representation of the output signal.

12. The system of claim 11, wherein the first and second current routers each comprise a differential pair of transistors.

13. The system of claim 11, wherein the output circuit includes at least one inverter on a signal path between the current comparator and the output of the output circuit.

14. The system of claim 11, wherein the output circuit comprises a plurality of serially-connected inverters.

15. The system of claim 11, wherein the output circuit includes at least a Schmitt trigger on a signal path between the current comparator and the output of the output circuit.

16. The system of claim 11, wherein the output circuit comprises a current-limited inverter.

17. The system of claim 11, wherein the output circuit comprises:
an inverter; and
a filter coupled to an output of the inverter.

18. A method of generating a digital voltage signal representing a differential on-off keyed input signal, comprising:
generating, by an isolator device, a first current signal representing activity of a differential OOK signal receiver;
generating a second current signal based on a common mode level of the differential OOK signal,
wherein the second current signal has a magnitude that is larger than a magnitude of the first current signal when the differential OOK signal is inactive;
comparing the first and second current signals; and
generating a binary voltage signal from the current comparison.

19. The method of claim 18, wherein the comparing comprises routing representations of the first and second current signals to a common node at different orientations to each other.

* * * * *